(12) United States Patent
Dunton et al.

(10) Patent No.: US 9,941,421 B2
(45) Date of Patent: Apr. 10, 2018

(54) SOLAR PHOTOVALTAIC MODULE RAPID SHUTDOWN AND SAFETY SYSTEM

(71) Applicant: Helios Focus LLC, Scottsdale, AZ (US)

(72) Inventors: Randy R. Dunton, Phoenix, AZ (US); Geoffrey Sutton, Scottsdale, AZ (US)

(73) Assignee: Helios Focus LLC, Scottsdale, AZ (US)

( * ) Notice: Subject to any disclaimer, the term of this patent is extended or adjusted under 35 U.S.C. 154(b) by 342 days.

(21) Appl. No.: 14/922,123

(22) Filed: Oct. 24, 2015

(65) Prior Publication Data

US 2016/0126367 A1 May 5, 2016
US 2018/0040745 A9 Feb. 8, 2018

Related U.S. Application Data

(60) Continuation-in-part of application No. 14/532,883, filed on Nov. 4, 2014, which is a continuation-in-part
(Continued)

(51) Int. Cl.
*H01H 47/00* (2006.01)
*H01L 31/02* (2006.01)
(Continued)

(52) U.S. Cl.
CPC ........ *H01L 31/02021* (2013.01); *H02S 40/32* (2014.12); *H02S 40/34* (2014.12);
(Continued)

(58) Field of Classification Search
USPC .......................................... 307/115
See application file for complete search history.

(56) References Cited

U.S. PATENT DOCUMENTS 5,693,952 A 12/1997 Cox
6,046,514 A 4/2000 Rouillard
(Continued)

FOREIGN PATENT DOCUMENTS

EP 1039361 9/2000
WO WO2009051870 4/2009
(Continued)

OTHER PUBLICATIONS

Li et al., A Current Fed Two-Inductor Boost Converter for Grid Interactive Photovoltaic Applications, Austalasian Universities Power Engineering Conference, Brisbane Australia, pp. 1-6 (2004).
(Continued)

*Primary Examiner* — Fritz M Fleming
*Assistant Examiner* — Dru Parries
(74) *Attorney, Agent, or Firm* — IPTechLaw

(57) ABSTRACT

A photovoltaic (PV) module safety shutdown system includes a module-on switch coupled with a PV module coupled with an alternating current (AC) mains panel through an inverter. A system monitor couples with the module-on switch and with the AC mains panel and generates a system-on signal. A module discharge switch couples with an inherent capacitance of the inverter and with the system monitor. The module discharge switch discharges the inherent capacitance, by coupling the inherent capacitance with a discharge element, in response to the system monitor not generating the system-on signal. In implementations a module short switch shorts the PV module in response to a passage of a predetermined amount of time after the module discharge switch is switched on. The module-on switch, module discharge switch, and module short switch may be included in a junction box of the PV module and coupled with the system monitor through multiple opto-isolators.

20 Claims, 22 Drawing Sheets

Related U.S. Application Data of application No. 14/511,042, filed on Oct. 9, 2014, now Pat. No. 9,369,126, which is a division of application No. 12/813,036, filed on Jun. 10, 2010, now Pat. No. 8,859,884.

(60) Provisional application No. 61/252,985, filed on Oct. 19, 2009.

(51) Int. Cl.

| | | |
|---|---|---|
| *H03K 17/795* | (2006.01) | |
| *H03K 17/687* | (2006.01) | |
| *H02S 50/00* | (2014.01) | |
| *H02S 40/32* | (2014.01) | |
| *H02S 40/34* | (2014.01) | |

(52) U.S. Cl.
CPC ........... *H02S 50/00* (2013.01); *H03K 17/687* (2013.01); *H03K 17/7955* (2013.01); *Y10T 307/76* (2015.04)

(56) References Cited

U.S. PATENT DOCUMENTS

| | | | |
|---|---|---|---|
| 7,161,082 | B2 | 1/2007 | Matsushita et al. |
| 7,807,919 | B2 | 10/2010 | Powell et al. |
| 8,204,709 | B2 | 6/2012 | Presher, Jr. et al. |
| 8,207,637 | B2 | 6/2012 | Marroquin |
| 8,963,375 | B2 | 2/2015 | DeGraaff |
| 9,000,615 | B2 | 4/2015 | Robbins |
| 9,525,286 | B2 | 12/2016 | Kohler |
| 2002/0014262 | A1 | 2/2002 | Matsushita et al. |
| 2006/0162772 | A1 | 7/2006 | Presher, Jr. et al. |
| 2006/0231132 | A1 | 10/2006 | Neussner |
| 2006/0267515 | A1 | 11/2006 | Burke et al. |
| 2007/0012352 | A1 | 1/2007 | Wohlgemuth |
| 2007/0186969 | A1 | 8/2007 | Kohler et al. |
| 2008/0097655 | A1 | 4/2008 | Hadar |
| 2008/0257397 | A1 | 10/2008 | Glaser et al. |
| 2009/0020151 | A1 | 1/2009 | Fornage |
| 2009/0141522 | A1 | 6/2009 | Adest et al. |
| 2009/0182532 | A1 | 7/2009 | Stoeber et al. |
| 2010/0043868 | A1 | 2/2010 | Sun et al. |
| 2010/0071742 | A1 | 3/2010 | de Rooij et al. |
| 2010/0071744 | A1 | 3/2010 | Peurach et al. |
| 2010/0071747 | A1 | 3/2010 | Brescia et al. |
| 2010/0154858 | A1 | 6/2010 | Jain |
| 2010/0269889 | A1 | 10/2010 | Reinhold et al. |
| 2012/0139343 | A1 | 6/2012 | Adest et al. |
| 2016/0036235 | A1 | 2/2016 | Getsla |

FOREIGN PATENT DOCUMENTS

| | | |
|---|---|---|
| WO | WO2010065043 | 6/2010 |
| WO | WO2010078303 | 7/2010 |

OTHER PUBLICATIONS

Endecon Engineering, A Guide to Photovoltaic (PV) System Design and Installation, Consultant Report to California Energy Commission, pp. 1-39 (2001).
TUV, solar panel micro inverter 260W/grid tie micro inverter, catalogue page, (http://sunconpv.en.alibaba.com/product/663777786-213426577/solar_panel_micro_inverter_260W_grid_tie_micro_inverter.html), download Sep. 20, 2013.
Build It Solar, (http://builditsolar.com/Projects/Vehicles/E15ElecTrak/PVCharge.htm), download Sep. 20, 2013.
Enphase Microinverter M190, Microinverter Technical Data, pp. 1-2, Enphase Energy, Inc., Petaluma, California, available as early as Jun. 9, 2010.
Enphase Microinverter Models M190 and M210 Installation and Operations Manual, 2010, Rev. 8, pp. 1-28, Enphase Enerby, Inc., Petaluma, California.
Quick Install Guide, Enphase Energy, Inc., Petaluma, California, available as early as Jun. 9, 2010.
Field Wiring Diagram, Enphase Energy, Inc., Petaluma, California, available as early as Jun. 9, 2010.
PCT Search Report, dated Jun. 21, 2011, Application No. PCT/US2010/053164.
International Preliminary Report, dated Apr. 24, 2012, Application No. PCT/US2010/053164.
Written Opinion of International Search Authority, dated Apr. 19, 2012.

SOLAR PHOTOVALTAIC MODULE RAPID SHUTDOWN AND SAFETY SYSTEM

CROSS REFERENCE TO RELATED APPLICATIONS

This application is a continuation-in-part application of the earlier filed U.S. Utility patent application Ser. No. 14/532,883, filed Nov. 4, 2014, titled "Solar Photovoltaic Module Safety Shutdown System," naming as first inventor Randy R. Dunton, now pending, which is a continuation-in-part application of the earlier filed U.S. Utility patent application Ser. No. 14/511,042, filed Oct. 9, 2014, titled "Solar Photovoltaic Module Safety Shutdown System," naming as first inventor Randy R. Dunton, now pending, which is a divisional application of the earlier U.S. Utility patent application Ser. No. 12/813,036, filed Jun. 10, 2010, titled "Solar Photovoltaic Module Safety Shutdown System," naming as first inventor Randy R. Dunton, issued as U.S. Pat. No. 8,859,884 on Oct. 14, 2014, which claims the benefit of the filing date of U.S. Provisional Patent Application Ser. No. 61/252,985, filed Oct. 19, 2009, titled "Solar photovoltaic module safety shutdown system," naming as first inventor Randy Richard Dunton, the disclosures of each of which are all hereby incorporated entirely herein by reference.

BACKGROUND

1. Technical Field

Aspects of this document relate generally to photovoltaic systems.

2. Background Art

FIG. 1 describes a typical photovoltaic (PV) grid-tied 100 or off-grid 110 system. A PV system consists of a number of modules 101; each module by itself generates power when exposed to light. A series of modules is wired together to create a higher voltage string 102. Multiple PV strings may be wired in parallel to form a PV array 103. The PV array connects to a DC-disconnect switch 104, and the DC disconnect switch feeds power to a grid-tied inverter 105 which converts the DC power from the array to AC power for the grid.

Off-grid systems 110 connect the PV array 103 to the DC disconnect, and on to a battery charger 111, which stores the electrical energy in batteries 112. Off-grid residential systems typically use an off-grid inverter 113 that produces AC electricity for AC loads connected to an AC mains panel 106.

Inside a silicon cell based module 200, shown in FIG. 2, there is a series of photovoltaic cells 201, the basic building block in solar electric systems. Each cell is producing approximately 0.5 volts and a few amps (e.g. 5 A). The PV cells are also wired in series and in parallel within the module to achieve a desired voltage and current, and each module has a positive and negative module terminal 202 to connect to the PV system. A typical module used in a residential or commercial power generating system will produce in the order of 18-50V DC at 90-200 W at its electrical connectors. There are two terminals one positive and the other negative. Arrays used in residential installations will typically produce power in the range of 2 kW-10 kW with voltages up to 600V DC (grid-tied). The module voltage and power output is true for other module architectures such as thin-film (CdTe, CIGS, etc.)

When a PV array is installed and operational, the PV system generates power whenever there is light present. Furthermore, it is impractical to disable the system beyond shutting off the AC mains or the DC disconnect. Once wired, the array itself is never able to fully shut down in the presence of light even with the DC disconnect in the open position. The string wiring connecting all the modules in series, the wiring to the DC disconnect, and the array will all continue to generate lethal levels of voltage when exposed to light.

In the case of a damaged array from fire or natural disaster, an open (non-insulated) wire of the array's circuits may present itself. The exposed circuits provide a higher likelihood of an unintended electrical circuit path to ground (ground fault), and a human can become a part of this path to ground either by touching or through exposure to water. With a human body in a ground fault circuit it is very likely to be lethal. The National Fire Protection Association (NFPA) 70E defines "low voltage" somewhere near ~50V. This low voltage is the threshold where one is able to generally survive a shock and "let go" (~9 mA). PV systems are well above this level. This poses a serious and very real problem for firefighters when they encounter a building on fire with a PV array.

Even an operational and properly insulated system poses a potential problem for service technicians in the case of a PV array in need of service. In the case of the need to replace a defective module the person may be exposed to high voltages even with the DC disconnect in the "off" or "open" position.

In the case of earthquakes, floods, or other natural disasters, partially destroyed PV systems pose a threat to the occupants of a structure and any rescue personnel, especially untrained civilians.

SUMMARY

Implementations of solar photovoltaic (PV) module safety shutdown systems may include: a module-on switch operatively coupled with a photovoltaic (PV) module, the PV module coupled with an alternating current (AC) mains panel through an inverter; a system monitor operatively coupled with the module-on switch and with the AC mains panel, the system monitor configured to generate a system-on signal, and; a module discharge switch operatively coupled with an inherent capacitance of the inverter and with the system monitor; wherein the module discharge switch discharges the inherent capacitance, by coupling the inherent capacitance with a discharge element, in response to the system monitor not generating the system-on signal.

Implementations of solar PV module safety shutdown systems may include one, all, or any of the following:

A module short switch may be included which shorts the PV module in response to a passage of a predetermined amount of time after the module discharge switch is switched on.

The module-on switch and the module discharge switch may be included in a junction box of the PV module.

The junction box may include a plurality of sockets configured to receive system-on signal cables.

The module-on switch and module discharge switch may be coupled with the system monitor through one or more opto-isolators.

A timer or a light sensor may be coupled with the system monitor and the system monitor may be configured to, using the timer or light sensor, cease generating the system-on signal during nighttime hours.

The PV module may not include a direct current (DC) optimizer.

The PV module may not include a microinverter.

Implementations of solar photovoltaic (PV) module safety shutdown systems may include: a photovoltaic (PV) module having a module-on switch, a module discharge switch, and a module short switch operatively coupled thereto, the PV module further coupled with an alternating current (AC) mains panel through an inverter, the PV module further coupled with a system monitor; wherein the system monitor is configured to generate a system-on signal and to supply the system-on signal to the PV module; wherein the module-on switch is configured to disable the PV module through disconnecting the PV module from an electrical circuit in response to the PV module not receiving the system-on signal; wherein the module discharge switch discharges an inherent capacitance of the inverter by coupling the inherent capacitance with a discharge element in response to the PV module not receiving the system-on signal, and; wherein the module short switch shorts the PV module in response to a passage of a predetermined amount of time after the PV module stops receiving the system-on signal.

Implementations of solar photovoltaic (PV) module safety shutdown systems may include one, all, or any of the following:

The module-on switch, the module discharge switch, and the module short switch may be included in a junction box of the PV module.

The junction box may include a plurality of sockets configured to receive system-on signal cables.

The module-on switch, the module discharge switch, and the module short switch may be coupled with the system monitor through one or more opto-isolators.

The PV module may not include a direct current (DC) optimizer and the PV module may not include a microinverter.

Implementations of solar photovoltaic (PV) module safety shutdown systems may include: a first photovoltaic (PV) module having a first module-on switch and a first module discharge switch, the first PV module operatively coupled with an alternating current (AC) mains panel through an inverter; a second PV module including a second module-on switch and a second module discharge switch, the second PV module operatively coupled with the AC mains panel through the inverter, and; a system monitor operatively coupled with the first PV module, the second PV module, and the AC mains panel, the system monitor configured to generate a system-on signal and supply the system-on signal to the first PV module and the second PV module; wherein, in response to the first PV module not receiving the system-on signal, the first module discharge switch discharges an inherent capacitance of the inverter by coupling the inherent capacitance with a first discharge element, and; wherein, in response to the second PV module not receiving the system-on signal, the second module discharge switch discharges the capacitor of the inverter by coupling the inherent capacitance with a second discharge element.

Implementations of solar PV module safety shutdown systems may include one, all, or any of the following:

The first module-on switch may be configured to disable the first PV module through disconnecting the first PV module from an electrical circuit in response to the first PV module not receiving the system-on signal, and the second module-on switch may be configured to disable the second PV module through disconnecting the second PV module from an electrical circuit in response to the second PV module not receiving the system-on signal.

The first PV module may include a first module short switch that shorts the first PV module in response to a passage of a predetermined amount of time after the first module discharge switch is turned on, and the second PV module may include a second module short switch that shorts the second PV module in response to a passage of a predetermined amount of time after the second module discharge switch is turned on.

The first module-on switch and the first module discharge switch may be included in a first junction box of the first PV module, and the second module-on switch and the second module discharge switch may be included in a second junction box of the second PV module.

The first junction box may include a plurality of sockets configured to receive system-on signal cables, and the second junction box may include a plurality of sockets configured to receive system-on signal cables.

The first module-on switch, the second module-on switch, the first module discharge switch, and the second module discharge switch may be coupled with the system monitor through one or more opto-isolators.

The system may not include a direct current (DC) optimizer and the system may not include a microinverter.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended solar photovoltaic module safety shutdown systems and related methods will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such solar photovoltaic module safety shutdown systems and related methods, and implementing components and methods, consistent with the intended operation and methods.

Typically a firefighter disables power to a dwelling at the AC mains panel of a home prior to dousing it with water. Shutting off power to the AC mains panel automatically disables every individual module in a photovoltaic (PV) array in one embodiment. In natural disasters the AC mains of a building will likely be off, again making the PV system safe in one embodiment. Additional systems allow for automatic shutdown in the case of natural disasters.

Figure 1:
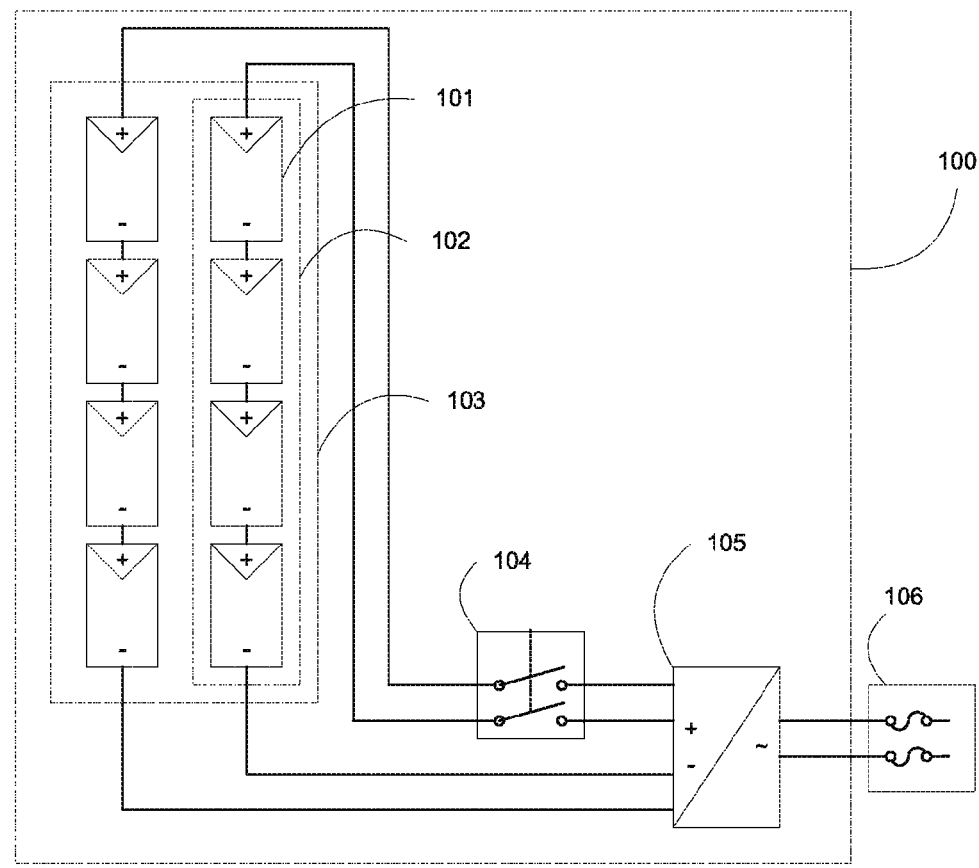
FIG. 1 illustrates two embodiments of a solar photovoltaic (PV) system with all the major system components.
Figure 1:
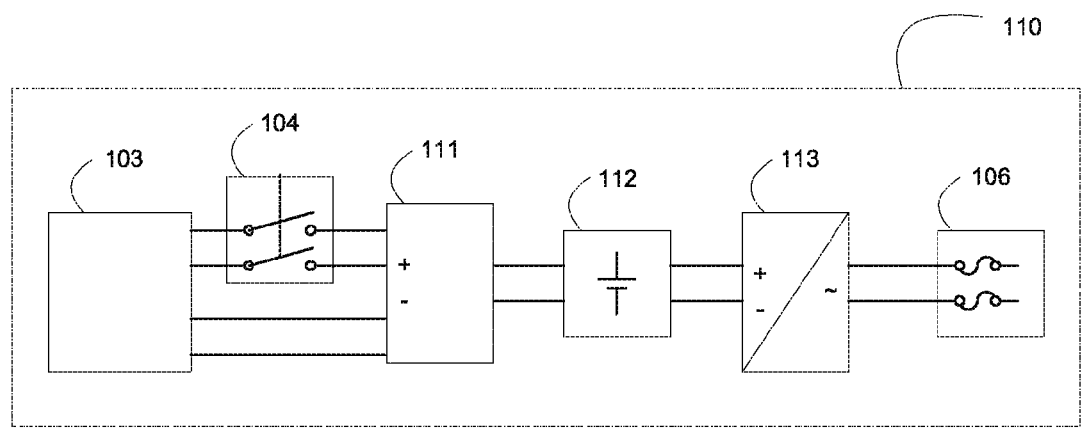
Figure 2:
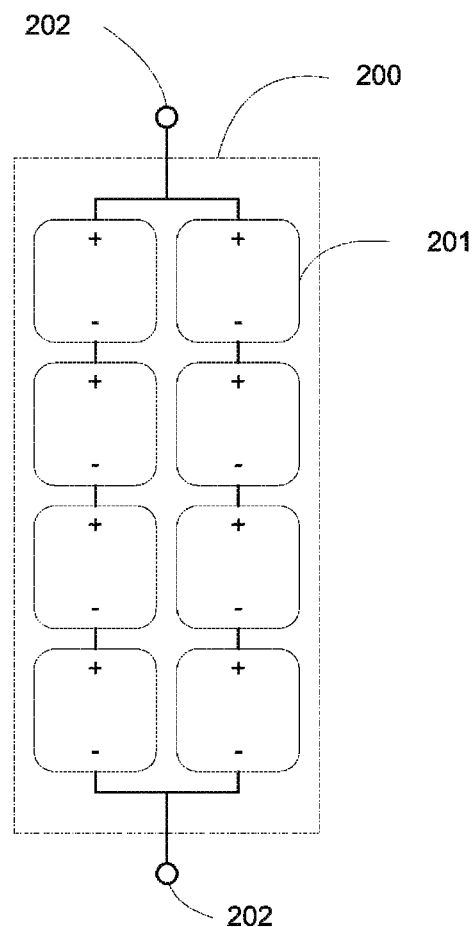
FIG. 2 illustrates the elements of a current PV module.
Figure 3:
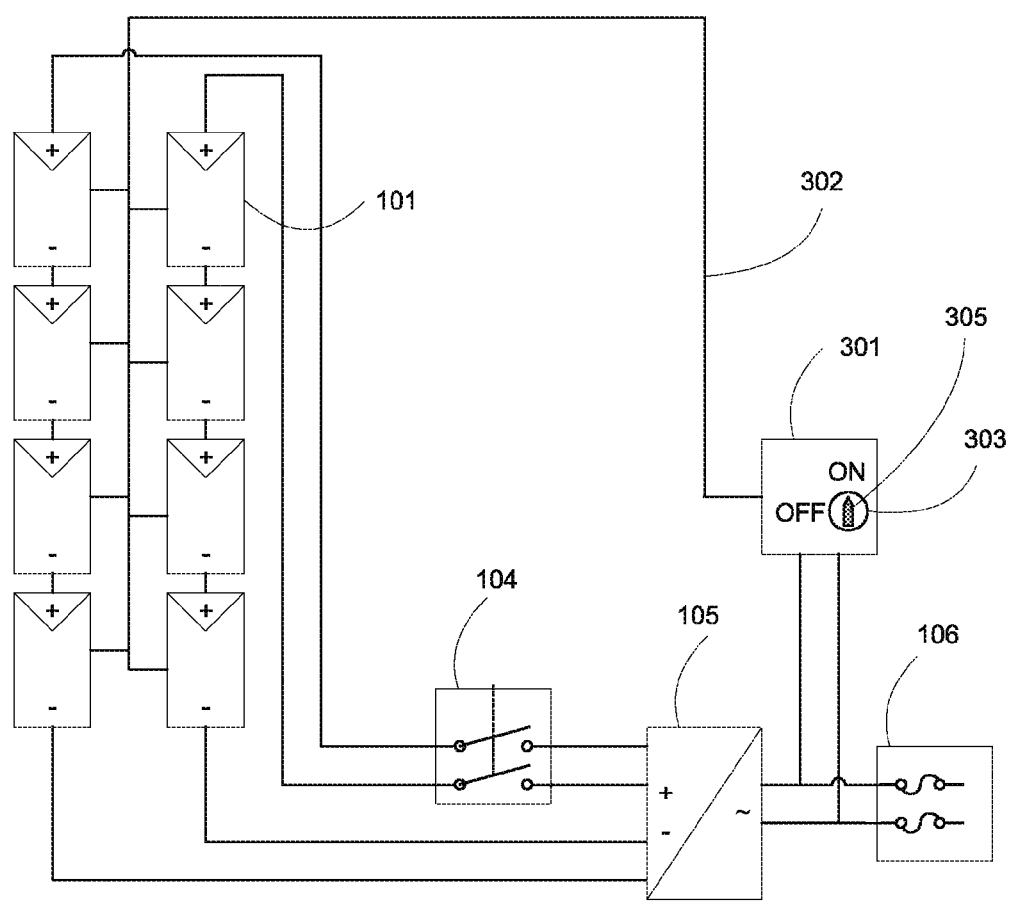
FIG. 3 illustrates an embodiment of a PV system with the additional system-level components.

A system-monitor device 301 creates a "system-on" signal 302, which each individual solar module receives to activate itself and operate normally, as shown in FIG. 3. This signal controls (i.e. enables or disables) each module individually. Disabling a module can be achieved, for example, by shorting out the module or by opening up the string circuit that connects all the modules together. The system-monitor device is connected to the AC power of the system, and when the AC power is off, the "system-on" signal is no longer "true."

Additionally, a manually operated switch 303 that is key operated may also be used to disable the PV system and each individual module therein, in some embodiments. The manual switch may be used by firefighters as well as service technicians to disable all the modules individually. It includes visual feedback 305 to indicate its state.

Figure 4:
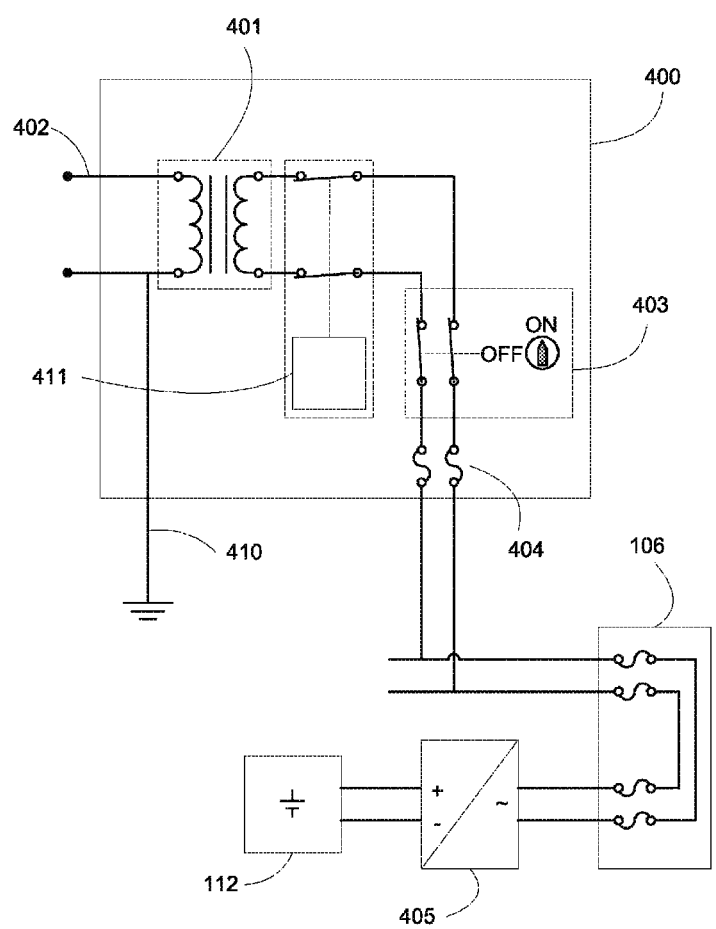
FIG. 4 illustrates the elements within the system-monitor function.

The system-monitor 400, shown in FIG. 4, generates the system-on signal for the modules to begin operation. In one embodiment this particular component is a simple step down transformer 401. Typically, 240 V AC from the AC mains panel is connected to the primary coil. The transformer generates a low voltage (e.g. −12V AC 60 Hz) signal pair 402 on the secondary coil. An active (e.g. 12V AC) signal indicates to the modules that the AC grid is on, or "system-on" is true. The active signal may be fed via a set of wires that is then routed to each module, for example, by "daisy chaining" the System-On signal to every module. The system-monitor device may have a manual switch 403 with a key-lockout that disconnects the step down transformer from the AC power operated by anyone who needs to disable the PV system.

The system-monitor may employ internal protection fuses 404 for fault conditions. In the case of an off-grid system, the off-grid inverter 405 supplies AC power in order for the system-monitor to operate. Depending on code or safety requirements, one leg of the system-on signal may be bonded to ground with a conductor 410.

For natural or man-made disasters, a motion, water or heat sensor and switch 411 may automatically disable the "system-on," for example, in case of earthquakes, floods, or fires. Those skilled in the art of electronic or electrical design recognize the many options to implement such a sensor switch.

Figure 5:
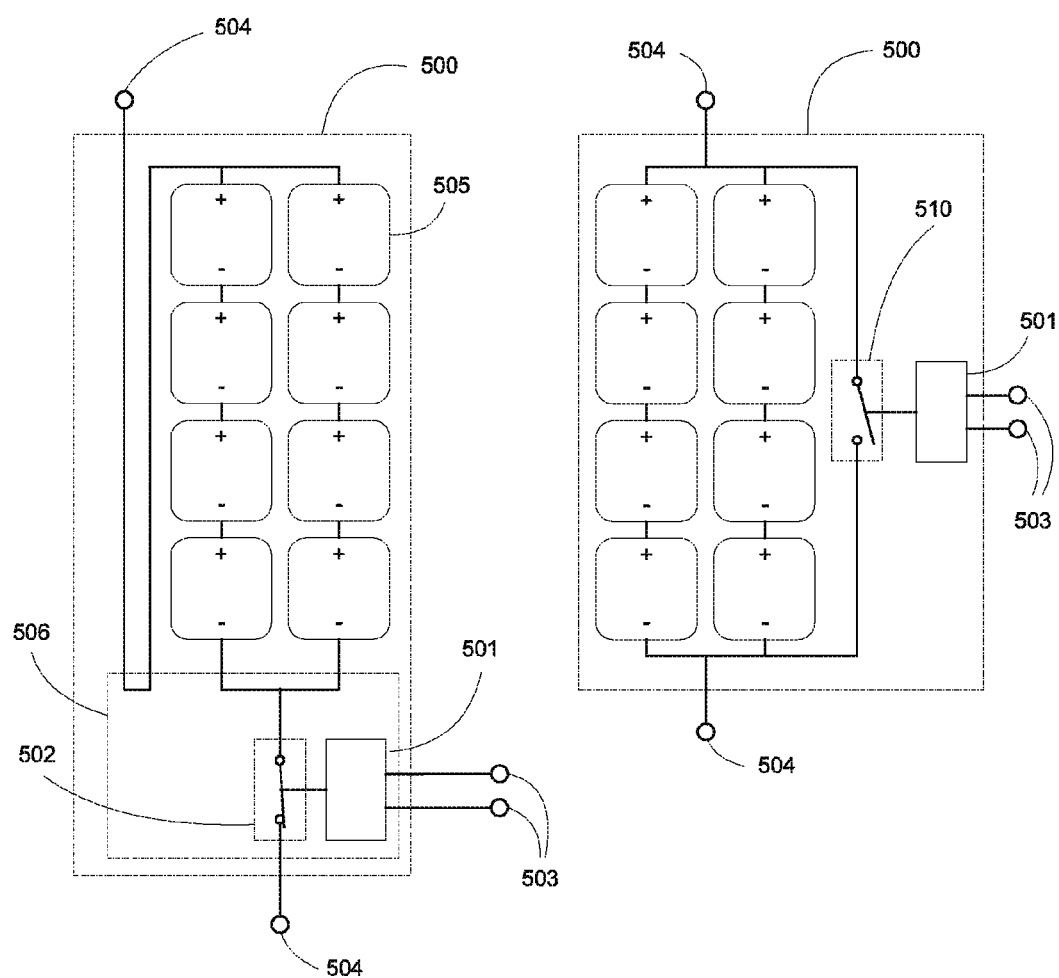
FIG. 5 illustrates the two possible methods to control an individual module.

FIG. 5 illustrates one embodiment of a mechanism to control the module's power production. Solar photovoltaic module junction box 506 may include a logic element 501 and module switch 502 may be part of the module assembly 500 (e.g. inside the module junction box) or be a separate element wired to the module (not shown). The system-on signal may be connected to the logic element with a twin lead connector 503. The module terminals 504 deliver direct current (DC) potential to other modules to form a string. The module switch 502 can be in series with the PV cells 505 and one of the module terminals, in this case the switch 502, disconnects the PV cells from the array. In a second embodiment, the module switch 510 can be in parallel to the PV cells, connecting to both module terminals. The junction box 506 may be a physical box that is secured to or integrated with a photovoltaic module. It may be attached by the module manufacturer at the time of manufacture or thereafter by third parties, in some embodiments.

Each of the module switches is electrically isolated from other module switches since each operates at a different voltage potential. This is due to the series wiring of the modules into a string and the fact that all the module switches share a common signal "system-on." A given module switch in a given array may be operating at a high potential (e.g. 400V) to ground, and the next module in the string at 350V, and so on, assuming each module generated 50 Volts (DC). Electrical isolation between the common System-On signal and the module switch can be achieved a number of ways including but not limited to AC transformer coupling, or optical coupling inside the logic element 501.

The logic element and switch circuitry can be designed in a number of ways. Those skilled in the art of electronic circuit design will understand the proper selection of the individual components, the detail of which is left out for clarity.

The electro-magnetic relay-based system uses electromechanical systems for isolation and switching. The signal system-on has enough power to energize a standard AC relay coil. The signal is operating at a voltage considered safe to humans (low voltage, e.g. 12V AC). To control a module using a relay, the switch may be in series or in parallel with the PV cells.

Figure 6:
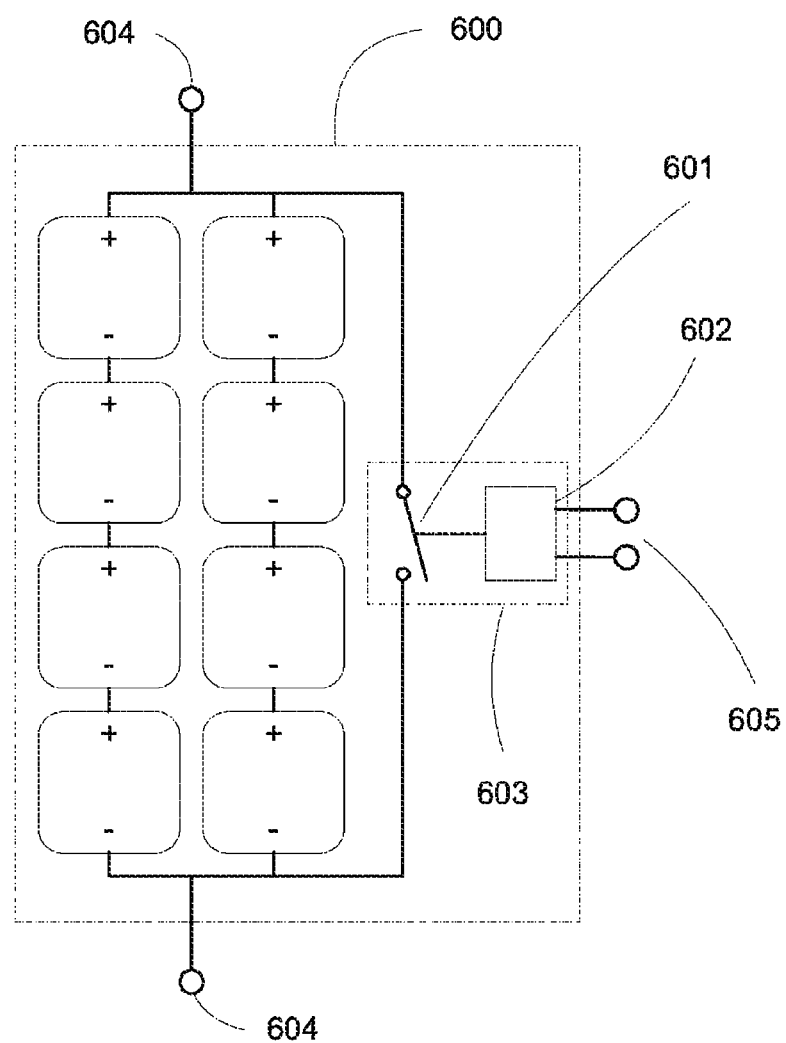
FIG. 6 illustrates a module embodiment utilizing an electromechanical relay as the means to control the module.

FIG. 6 shows the circuit of a module assembly 600 with the module switch in parallel. In a system where the signal system-on is true (e.g. 12V AC) the energized coil 602 moves the normally closed (NC) contact 601 of the relay 603 to open up and allows the cells to produce power at the module terminals. The power from the system-on signal connects to the relay's coil through the two-contact system-on connector 605, and the isolation between the system-on signal and the module switch is provided inherently between the relay coil and the relay's contact.

Figure 7:
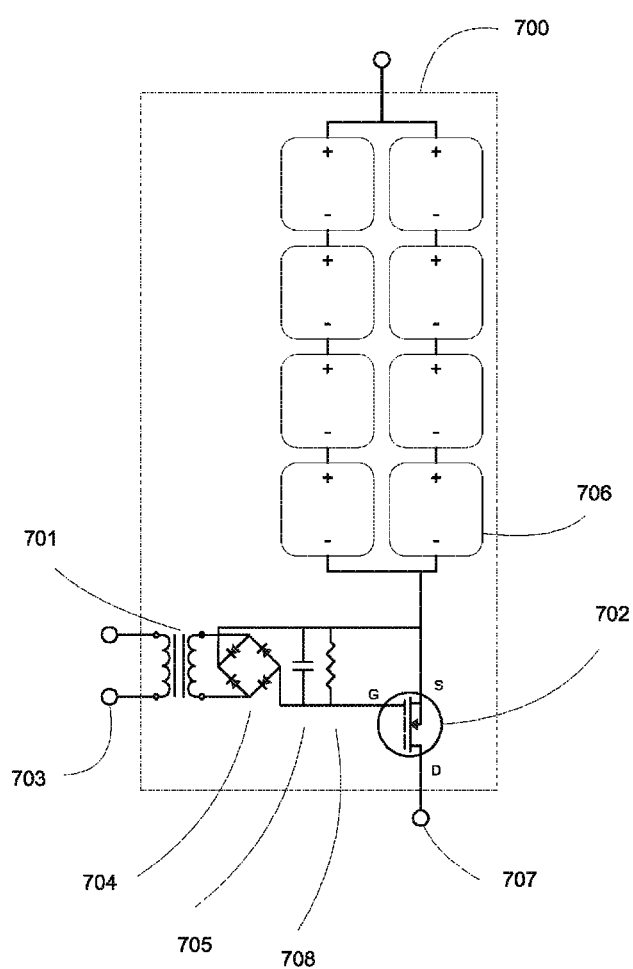
FIG. 7 illustrates a module embodiment utilizing a transformer and transistor as the means to control the module.

FIG. 7 shows the circuit of a module assembly 700 utilizing a small transformer 701 along with a few other components and a transistor 702 to perform the logic element and module switch functions. A basic transformer AC couples the system-on signal, present at the connector 703, through a primary coil to a secondary coil. The primary and secondary coils provide the needed isolation. The coupled and isolated system-on signal is now converted to a DC control signal, for example, through a 4-diode rectifier 704, and the rectified AC ripples are reduced with a capacitor 705. This circuit provides a positive voltage of sufficient level to turn on a power MOSFET transistor 702. The MOSFET source terminal is connected to the negative terminal of the first in a series of cells 706, and the MOSFET drain terminal is connected to the module negative terminal wire 707.

When the system-on signal is false (0V AC), the transistor is off due to the gate voltage (Vgs) being zero, and the module is disconnected from the other modules in the array. With the signal present the transistor will be on and it will close the circuit with the other modules in the string. To ensure the transistor turns off without a system-On signal, a resistor 708 discharges the capacitor.

Figure 8:
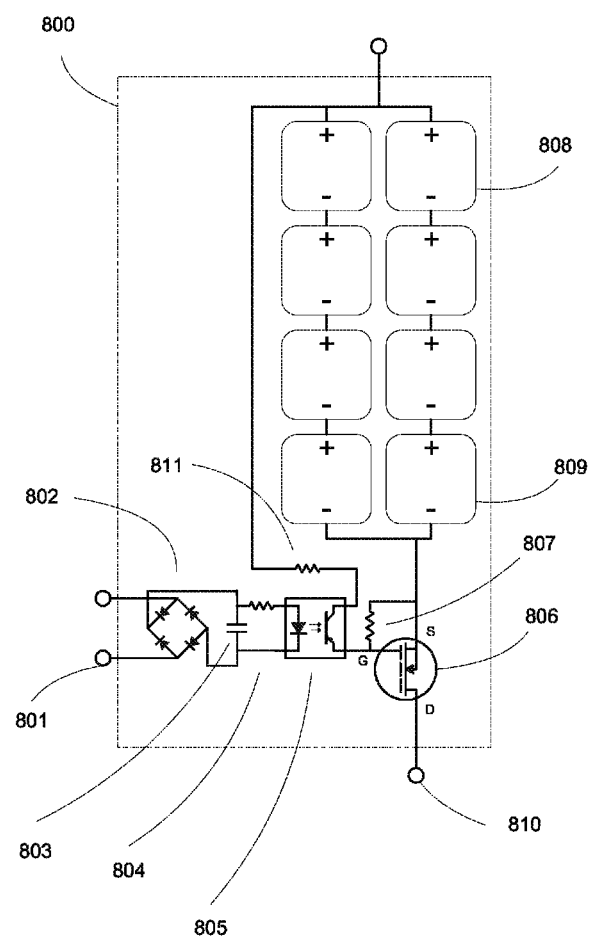
FIG. 8 illustrates a module embodiment utilizing an opto-isolator and transistor as the means to control the module.

The transformer in the previous example can be replaced with an opto-isolator component, as shown in FIG. 8. The system-on signal at the system-on connector 801 is converted to a DC voltage with a diode rectifier 802 and capacitor 803. The DC voltage is current limited through a series resistor 804 to operate the opto-isolator's 805 transmitter (LED). The light energy will activate a photosensitive photo detector (e.g. transistor) in the opto-isolator, the light is providing the electrical isolation. When light is present the opto-isolator's transistor is conducting current, otherwise not. The opto-isolator transistor controls a MOSFET transistor 806, able to handle the module power loads. The N-channel MOSFET is by default off (or open) since the gate is pulled down to the same level as the source with a resistor 807. When the opto-isolator's transistor is on it will raise the voltage of the MOSFET's gate close to the level present at the positive terminal of the last cell in the module 808 if light is present. The MOSFET will be in fully saturated mode and "on," connecting the negative terminal of the first cell 809 to the module's negative terminal 810 allowing the module current to flow through the array. The voltage feeding the gate may need to be limited to protect the MOSFET depending on the choice of components; this can be achieved with an additional resistor 811.

Figure 9:
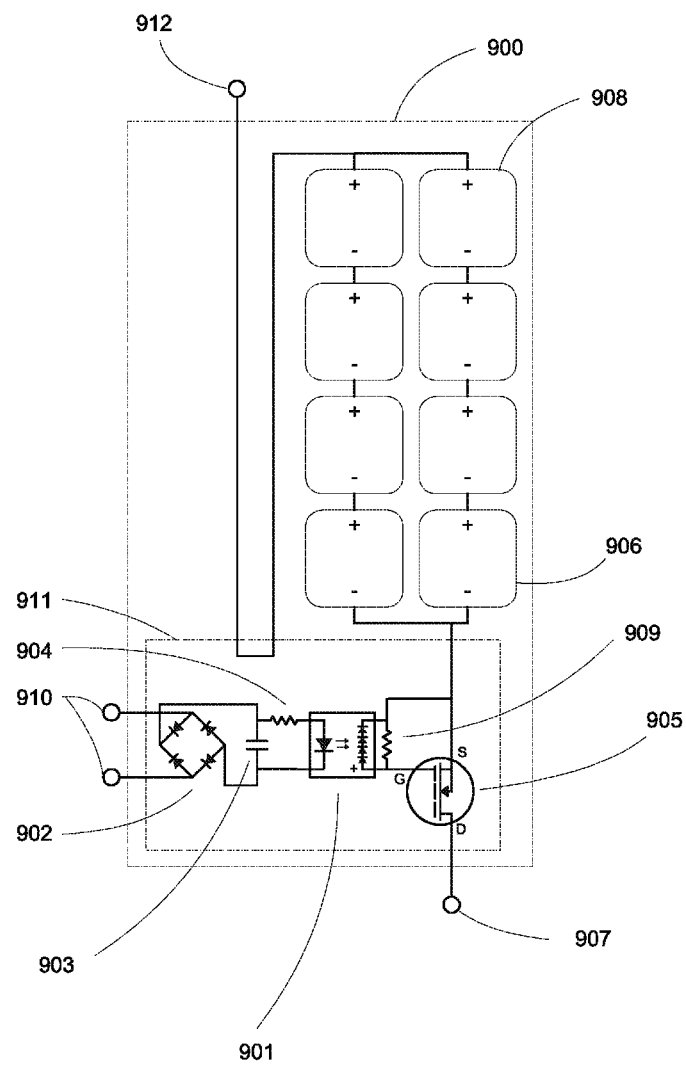
FIGS. 9 and 10 illustrate a module embodiment utilizing an FET driver and transistor as the means to control the module.

In FIG. 9, solar module 900 junction box 911 utilizes a photovoltaic MOSFET (PV FET) driver 901 as the isolation function. The system-on signal is converted to DC through the rectifier 902, capacitor 903, and is current limited through a resistor 904 as it drives the light transmitter (LED) of the PV FET driver. The light energy will be converted by the PV FET driver's photodiodes to a DC voltage of sufficient voltage to directly drive the MOSFET transistor 905 to a fully saturated mode. This in turn will connect the negative terminal of the first cell 906 to the negative module terminal 907. A resistor 909 will guarantee that the transistor will be off by default, by discharging any energy stored from leakage or stray capacitance. The positive module terminal 912 is coupled to cells 908. System-on connector 910 may use twin leads.

Figure 10:
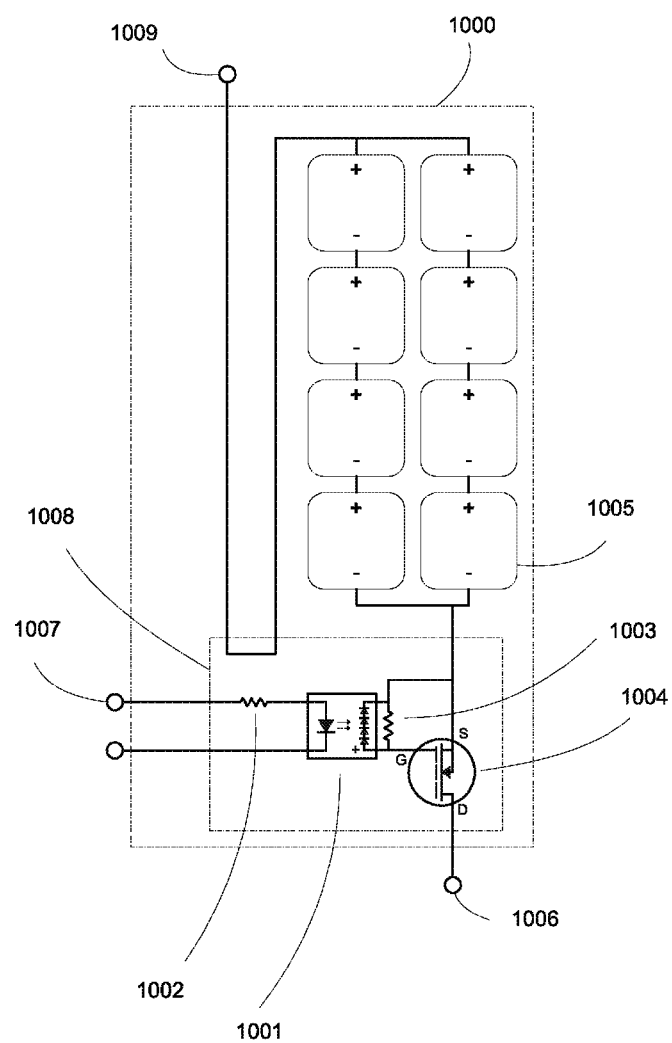

FIG. 10 illustrates another design, which has very few components for reliability and low cost. The system-on signal current (via connector 1007) is limited through resistor 1002 and drives the photo-diode of the FET photovoltaic driver 1001 in the solar module 1000 junction box 1008 to generate light energy for half of the AC cycle. The light energy is converted by the FET-driver to a DC voltage, which is applied to the MOSFET transistor 1004. The inherent gate capacitance of the MOSFET is sufficient to store the needed voltage to turn on the FET for the entire AC cycle, thus eliminating any gate charge storage device. A resistor 1003 turns off the FET to bring it to desired default state of "off" by draining the FET gate charge when the system-on signal is not present. When the system-on signal is present, the transistor is on or fully saturated. This in turn connects the negative terminal of the first cell 1005 to the negative module terminal 1006.

Figure 11:
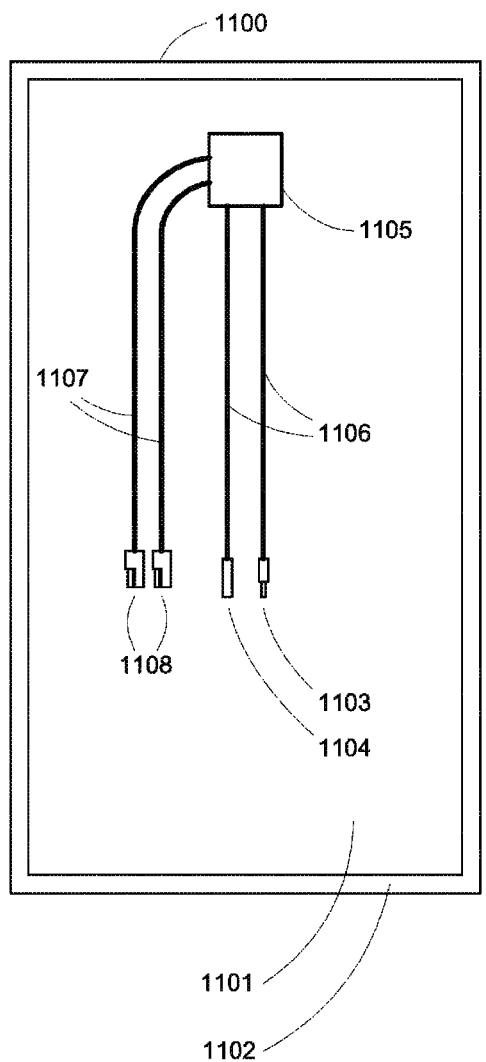
FIG. 11 is a depiction of the back side of one embodiment of a solar module.

Finally, referring to FIG. 11, the back side of a solar module, such as the solar module 1100, is depicted. The back side is the side which is not exposed to receive solar energy. The back side of the module 1100 may include a back sheet 1101. In one embodiment, the junction box 1105 may be integrally formed within the back sheet 1101. In other embodiments, it may be a physical box, such as a plastic electrical box, accessible through the back sheet 1101. A pair of leads 1106 may be provided with a positive terminal 1103 and a negative terminal 1104 to connect a DC potential to the neighboring modules into a string. A second pair of leads 1107 may be provided to "daisy chain" the system-on signal from one module to the next. The connectors 1108 for the system-on signal contain two contacts each.

Another approach is to deliver the signal representing "system-on" as a light signal to the modules. This example requires a modification to the system-monitor device, which will be sending light instead of an AC signal. Each module receives a fiber optic cable and the light received is converted to a voltage as in the case of the MOSFET driver through a series of photo diodes to a voltage level sufficient to turn on the FET.

Those skilled in the art of electronics can appreciate the possible variations of connecting a common signal (system-on) with some form of energy such as an AC or DC voltage, radio waves, or light to an isolated logic element. The logic element in turn drives a module switch that enables power output from the module. The Switch itself may also be integrated into one of the cells in the series (gated cell). Furthermore the circuit that controls the PV module may be part of the module or a separate system component that the module will plug into. The previous examples illustrate a few of the possible ways to implement the principle idea.

In systems with a number of distributed inverters, one for each module, there is no equivalent of the DC disconnect switch, and by turning off the AC mains the PV system will shut down if the micro-inverters are operating as expected. However the ability to shut the PV system down by disabling the power generated from the module itself via the system-monitor device (using the manual lockout switch) provides an additional safety measure and more importantly a consistent and clear visual means to firefighters to ensure that the PV array is indeed off. It also provides a safe and lockable means to people servicing the modules.

Currently a module is "live" the moment it leaves the module factory; there is no "off" switch. Like a charged car battery, PV modules are dangerous to the untrained, and able to generate power. Once an array is wired into a PV system it is a permanent installation and is not ever typically disconnected. The array wires pose a particularly lethal level of power to people since the voltages are typically 200-600V, which by NFPA NEC (National Electric Code) definition is well above "low voltage systems." The only practical means of switching off an array is at the singular DC disconnect point where the lethal voltage levels are present even when switched off. Firefighters are trained to shut off the DC disconnect and the AC mains to a building, however even after both of these actions occur the power generated by the array continues to be present in the array, within the modules, and the wiring on the roof or inside the home leading up to the DC disconnect. If a firefighter were to use an axe to ventilate a roof, cut a wire, cut into a module, or douse a broken array with water—the firefighter would be exposed to high voltages. A path of lethal current to (earth) ground will exist. Additionally if a PV service technician were diagnosing a faulty array for ground faults, or replacing a broken module, this person will be exposed to very high voltages, requiring very careful conduct without any mistakes to remain safe. Electricians prefer in all cases to "lock out and tag out" any circuit they are working on, however a PV array cannot be shut down by any practical means.

By installing a switch in each module it is possible to deactivate each individual module to a level where the voltages will be in the order of 18-50 volts or less. At these levels it is safe to handle the modules or any components of the array.

Each module receives a "system-on" signal, a corresponding logic element, and a switch in or near the module will perform the control of each individual module. These may take the form of simple coils and relays or in other embodiments optical and electronic components. The reliability or cost of these simple components does not pose a cost burden nor a reliability challenge for module manufacturing. Each module has a junction box with a few electronic components in it today (diodes), and this shutdown system can add a few more to the module. In addition to the module switch the PV system may use a system-monitor device. This function may be built into the grid-tie inverter or the off-grid battery charger to lower overall parts and costs.

Figure 12:
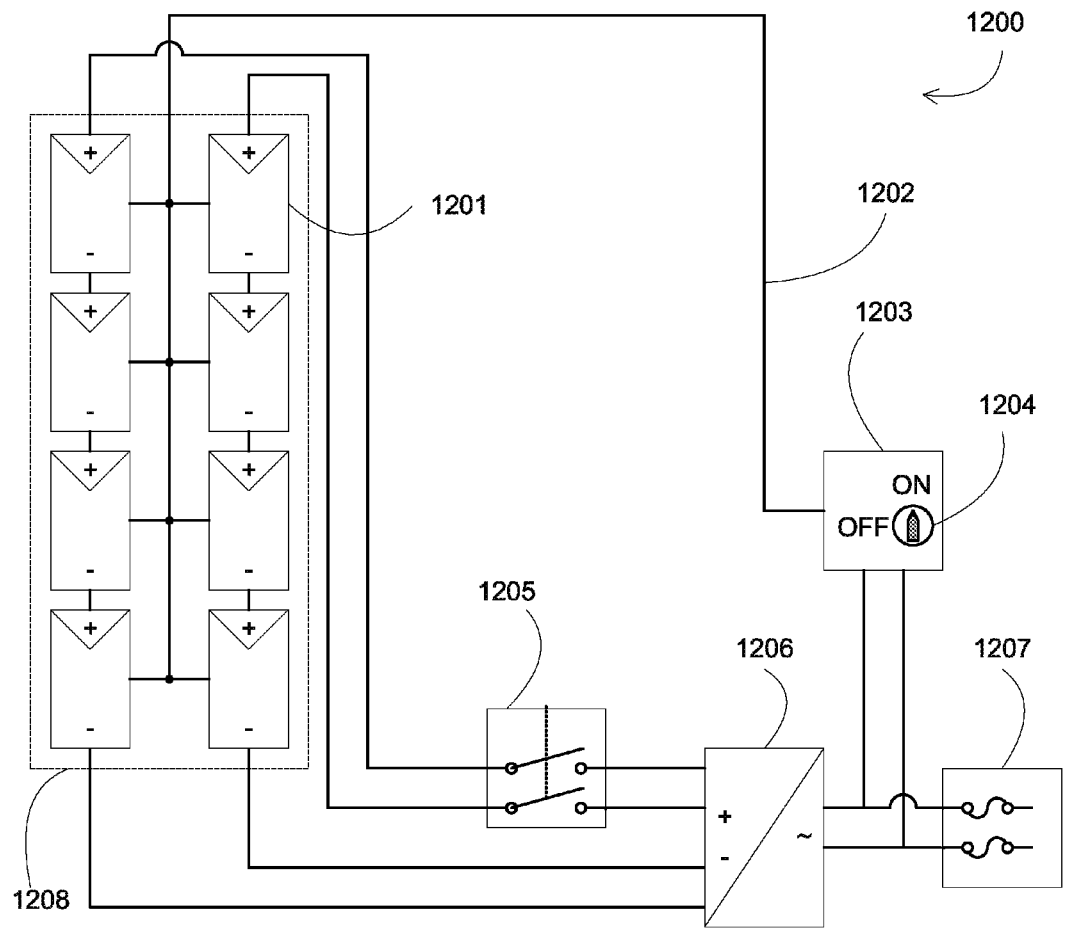
FIG. 12 is a schematic diagram of an implementation of a photovoltaic (PV) system.

Referring now to FIG. 12, a solar photovoltaic (PV) module safety shutdown system 1200 (system) is shown. The system 1200 shown is a grid-tied system, though in other implementations, an off-grid system may be used. PV system 1200 consists of a number of PV modules 1201. Each PV module 1201 individually generates power when exposed to light such as, by non-limiting example, sunlight or another other source of light for which the PV module has been designed to generate electricity. A series of PV modules 1201 is wired together to create a PV array 1208. The PV array 1208 connects to a DC-disconnect switch 1205 and the DC disconnect switch 1205 feeds power to a grid-tied inverter 1206 which converts the DC power from the PV array 1208 to AC power for the grid by connection to an AC mains panel 1207, which is tied to the grid (not shown). A system-on signal 1202 is used to allow each individual PV module 1201 to be operational when it is safe to provide power to the PV array 1208. The system-on signal 1202 can be provided by a system-monitor 1203 which in implementations may have a manual switch 1204.

Figure 13:
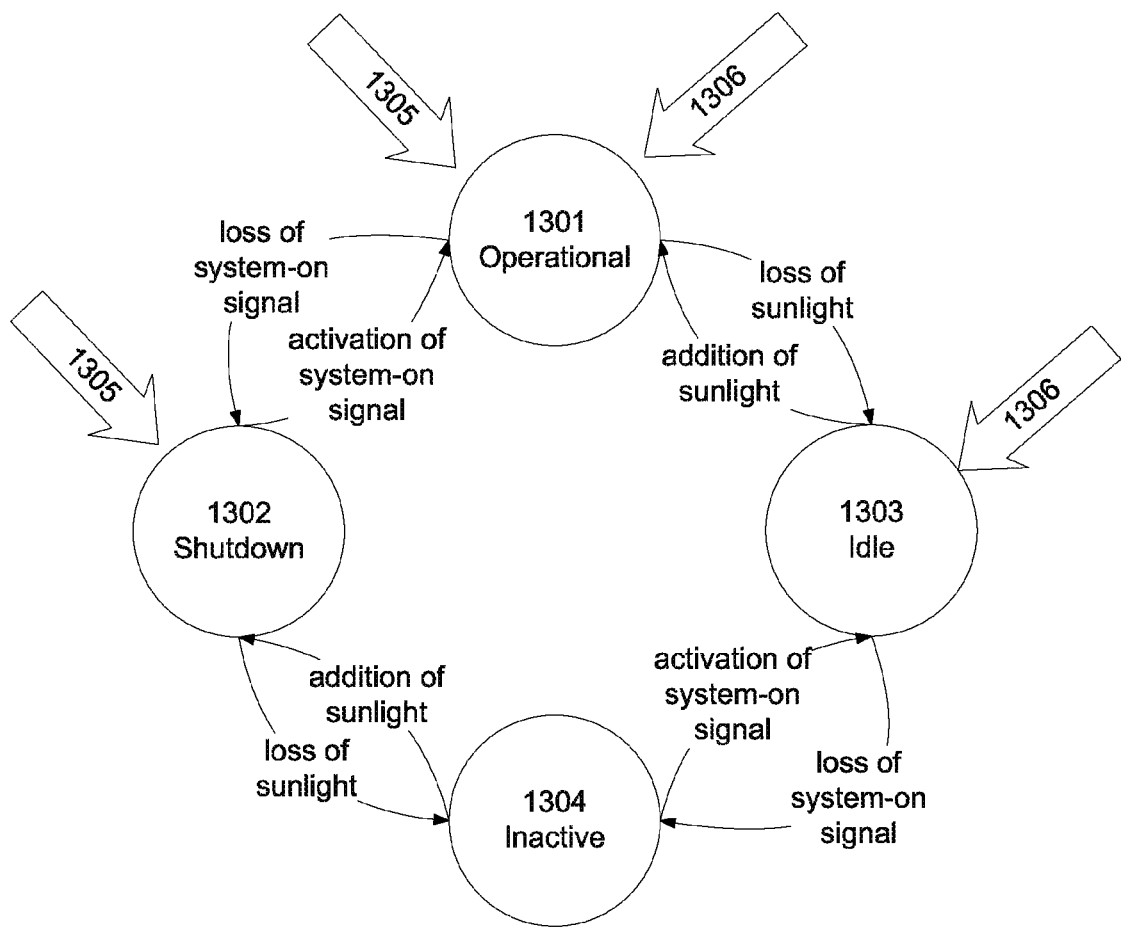
FIG. 13 is an illustration representatively showing various states of the PV system of FIG. 12.

FIG. 13 describes the four states that the PV modules 1201 of the PV system 1200 can normally be in: an operational state 1301; a shutdown state 1302; an idle state 1303; and an inactive state 1304. Some state transitions are shown but, for clarity, not all state transitions are illustrated. The operational state 1301 occurs when the PV modules 1201 are being irradiated with light 1305 and the system-on signal 1306 is active. In the operational state 1301 power is provided from the PV array 1208 to the inverter 1206. The shutdown state 1302 occurs when the PV modules 1201 are being irradiated with light 1305 but the system-on signal 1306 is inactive. In the shutdown state 1302 power is not provided by the PV array 1208 to the inverter 1206. The idle state 1303 occurs when the system-on signal 1306 is active, but the PV modules 1201 are not being irradiated with light 1305 (such as during nighttime hours). In the idle state 1303 power is not provided by the PV array 1208 to the inverter 1206. The inactive state 1304 occurs when there is no system-on signal 1306 and the PV modules 1201 are not being irradiated with light 1305. In the inactive state 1304 power is not provided by the PV array 1208 to the inverter 1206. Accordingly, only in the operational state 1301 are the PV modules 1201 of the PV system 1200 in a condition to present any danger to people or property.

Figure 14:
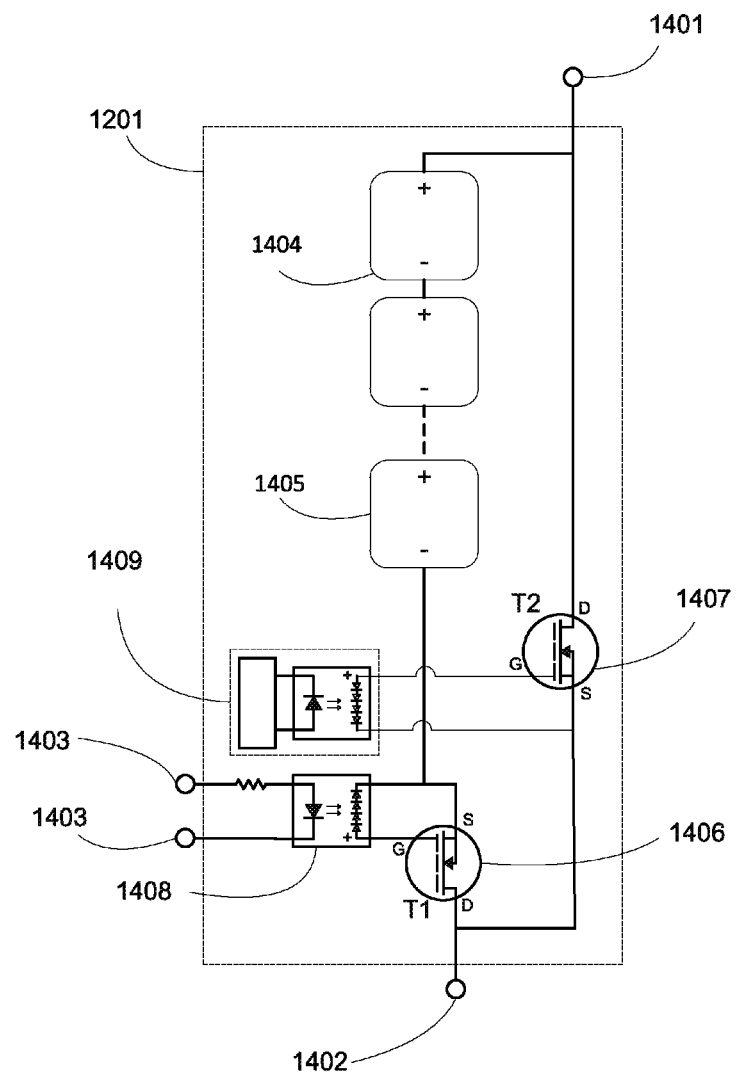
FIG. 14 is a schematic diagram of various elements of the PV system of FIG. 12.

Referring now to FIG. 14, several elements of PV module 1201 are shown. The PV module 1201 includes a series of photovoltaic cells starting with a first cell 1405 and ending with a last cell 1404. The PV module 1201 may include any number of cells, or just one cell, and this is representatively illustrated by the dashed line between the first cell 1405 and the cell directly above it. A module positive connector (MPC) 1401 connects to the last cell 1404 and also connects to a module-off switch 1407 which is configured to selectively force the PV module 1201 into the shutdown state 1302 by providing a low impedance path to the module negative connector (MNC) 1402. The MNC 1402 also connects to the module-on switch 1406 which either connects the first cell 1405 to the MNC 1402 when the PV module 1201 is in the operational state 1301 or idle state 1303, or else isolates the first cell 1405 from the MNC 1402 if the PV module 1201 is in the shutdown state 1302 or inactive state 1304.

In the example shown the module-on switch 1406 is controlled by the FET driver 1408. The FET driver 1408 in various implementations is an opto-isolator and so uses the system-on signal 1202 to generate light internally, which light in turn is used to generate an FET gate driving signal that is electrically isolated from the system-on signal 1202, as has been discussed herein with respect to other implementations of solar photovoltaic module safety shutdown systems. In implementations the FET gate driving signal is a voltage that is applied across the gate and source terminals of the module-on switch 1406. The system-on signal 1202 is supplied to the FET driver 1408 via the system-on connectors 1403 which in various implementations are attached to the PV module 1201. As seen in FIG. 14, the module-on switch 1406, in particular implementations, includes a transistor T1 and the module-off switch 1407 includes a transistor T2. Notations for the gate, source and drain of each transistor are a represented in the figures with the letters G, S and D, respectively.

Figure 15:
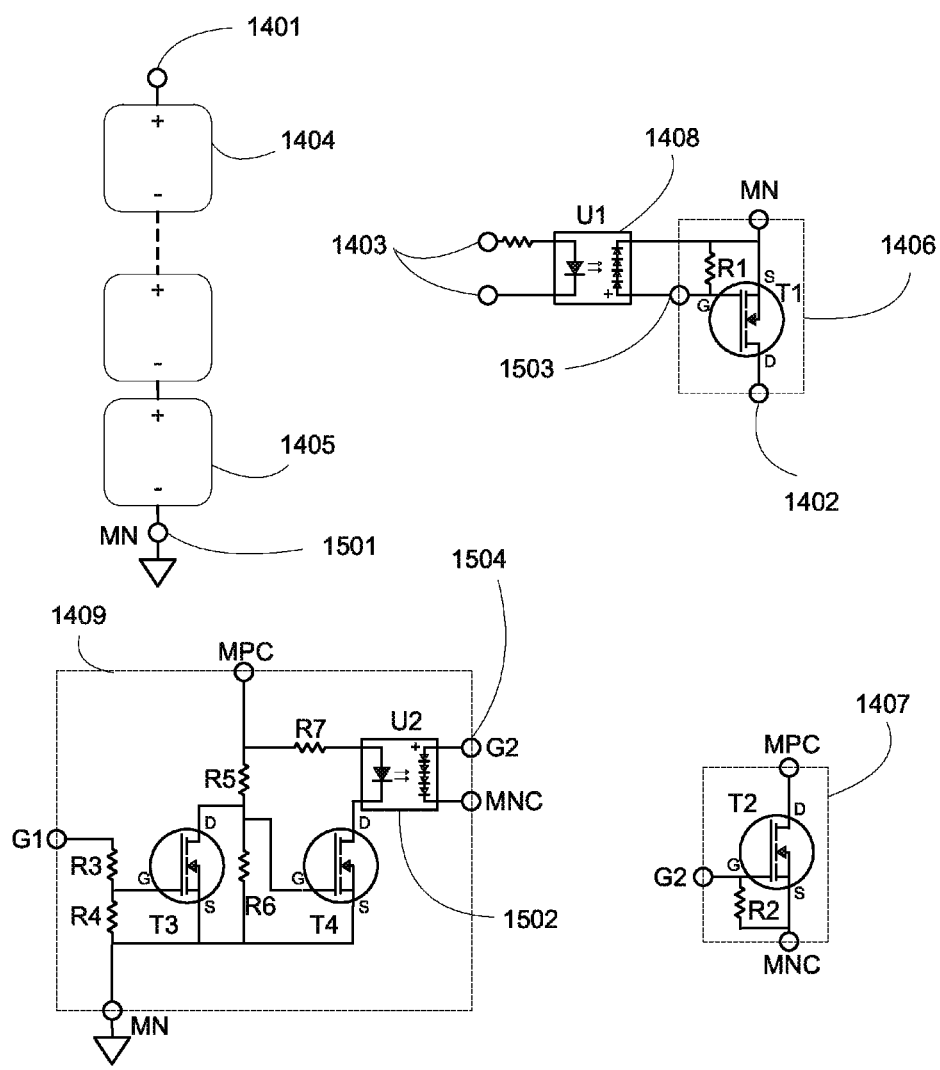
FIG. 15 is another schematic diagram of various elements of the PV system of FIG. 12.
Figure 16:
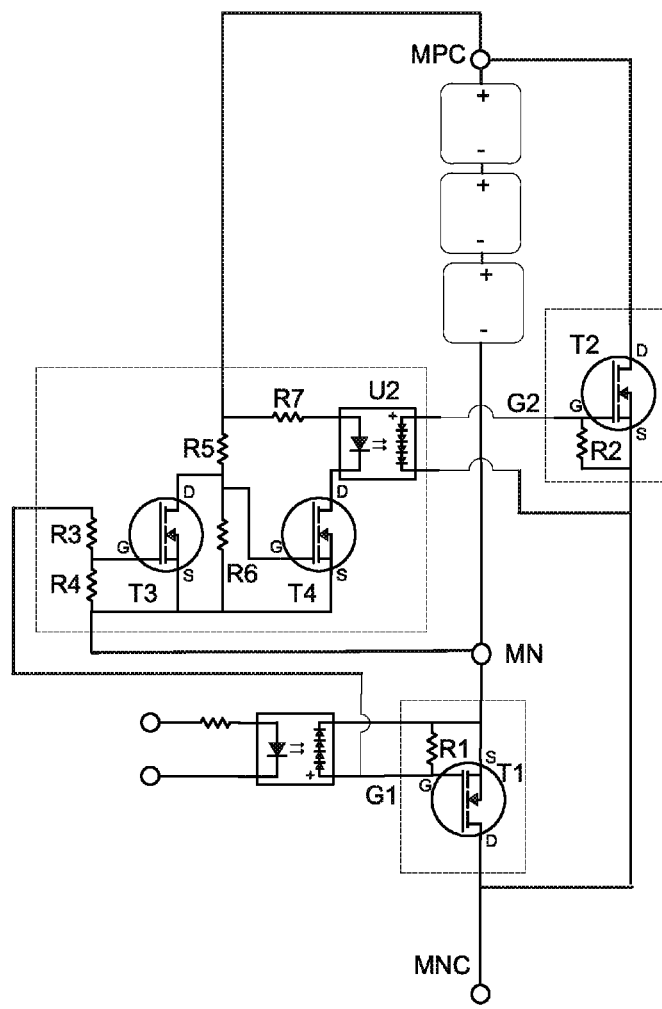
FIG. 16 is another schematic diagram of various elements of the PV system of FIG. 12.

Referring now to FIGS. 15-16, circuit-level diagrams of an implementation of a system 1200 are depicted. Conventional PV module bypass diodes are not shown and do not interact with the functions of the elements described hereafter. Each functional circuit is grouped for clarity, and in FIG. 15 interconnections between the functional circuits are illustrated symbolically using nomenclature described below, while in FIG. 16 the functional circuits are shown coupled together. Many different internal circuit components and connections are possible using the principles disclosed herein, and those illustrated in the drawings are only given as representative examples of ways to achieve the four states 1301-1304 of the PV system 1200.

In the operational state 1301, the gate voltage gate 1503 (G1) of the module-on switch 1406 (T1) will be positive in relation to the module negative node 1501 (MN). The positive G1 signal is provided by the FET driver 1408 (U1). MN is the negative terminal of the first cell 1405. The gate source voltage provided by an active G1 will turn T1 fully on. G1 is also used in the module-off logic 1409 which includes resistors R3, R4, R5, R6, and R7, transistors T3 and T4, and FET driver 1502 (U2). R1 provides a mechanism for the module-on switch 1406 to turn off when G1 is no longer active.

Resistors R3 and R4 divide the G1 signal voltage in order to turn on transistor T3 whenever the system 1200 is in the operational state 1301. If there is light present on the cells the module positive connector (MPC) 1401 will have a voltage present on in the order of about +30V relative to MN for a typical PV module 1201. This voltage is divided between R5 and R6 to control T4. If T3 is on, the voltage across R6 will be close to zero and T4 will then be off, resulting in the operational state 1301.

Alternately if light is present on the PV cells (MPC to MN ~30V) and the system-on signal 1202 is not present (G1 to MN=0V), then T4 is on, providing a path to ground (MN) for the current to flow from MPC though the (current limiting) resistor R7 to activate the FET driver U2 (1502). This state is the shutdown state 1302, wherein the module-off switch 1407 is on (low impedance). The FET driver U2 will drive the module-off switch T2 (1407) via the gate voltage of gate 1504 (G2) which is relative to the gate and source of T2 (G2 & MNC). R2 provides a mechanism for the module-off switch 1407 to turn off when G2 is no longer active.

When the system is in the operational state 1301 or idle state 1303 the module-on switch 1406 is on and the module-off switch 1407 is off. In the shutdown state 1302 the module-on switch 1406 is off and the module-off switch 1407 is on. In the inactive state the module-on switch 1406 is off and the module-off switch 1407 is also off.

Though not explicitly labeled in the drawings, at least two separate circuits are formed by the various elements of system 1200. A first circuit includes the PV cells and the module-on switch 1406. This is the main power line through which the power from the PV module 1201 travels through and exits the system 1200. The module-off logic 1409 and module-off switch 1407 are tied into this first circuit as well. A second circuit includes the elements which supply the system-on signal 1202 to turn on the module-on switch 1406, and as indicated in the drawings the first circuit is electrically isolated from the second circuit, such as through the use of an opto-isolator, a transformer, and/or the like, though the first circuit and second circuit are communicatively coupled.

In implementations the module-on switch 1406 and module-off switch 1407 may be integrally formed in or within a back sheet of the PV module 1201. This can be done through various mechanisms now known or hereafter discovered.

Each module-off switch 1407 protects one module-on switch 1406 from overvoltage in the event of wiring errors or faulty system-on signals 1202 of the PV system 1200 and provides a rapid shutdown of the PV array 1208 by individually shorting out one PV module 1201 of the PV array 1208 in the absence of the system-on signal 1202. In implementations the rapid shutdown may entail discharging the PV array 1208 in a timely fashion to a voltage considered safe by the National Electric Code (NEC). Each module-off switch 1407 may be configured to bring its individual PV module 1201 to a non-lethal voltage, and thus the plurality of module-off switches 1407 in a PV array 1208 are configured to cause there to be only non-lethal voltage for any given PV module 1201 when the module-off switches 1407 are turned on.

An overvoltage condition for the module-on switch 1406 can occur if all but one PV module 1201 (or a few but not all) is turned on. The DC array voltage of the PV array 1208 can be in the range of 600-1000V, and a typical low impedance FET used for the module-on switch 1406 will withstand ~60V between the source and drain. In standard operating conditions all the module-on switches 1406 of the PV array 1208 will switch at the same time, opening the PV array 1208 circuit in multiple places at once, and preventing any over voltage conditions for any given module-on switch 1406. Thus each module-on switch 1406 will remain below its maximum operating range.

If only one module-on switch 1406 were to open (turn off) due to a system-on signal 1202 wiring fault, and the rest were to remain on, then the opening switch would experience the full voltage of the PV array 1208. In order to protect from this condition, which may cause permanent damage to the opening switch, the voltage across the module-on switches 1406 is controlled in more than one way.

By adding the module-off switch 1407, which enables in its on state a low impedance path across the module (power) connectors 1401/1402, the voltage is then controlled (limited) for the system-on switches 1406. This has the additional benefit that under normal operating conditions (no wiring errors) and when the system 1200 is shut down, each PV module 1201 will provide a low impedance path to discharge the PV array 1208 wiring and the inverter, thus bringing the entire PV system 1200 to a safe state in rapid fashion.

In implementations the PV module 1201 itself provides the power to run the safety mechanism. In implementations, shorting out a PV module 1201 across all the PV cells provides no voltage (or power) present in the PV module 1201 to power any logic to turn the PV module off. One way to short out one PV module 1201 in the PV array 1208 and at the same time retain the power in each individual PV module 1201 to run the safety logic is to simultaneously open up a connection from a module connector 1401/1402 to the module cells, isolating the PV module 1201 from one of the module connectors 1401/1402 (and other PV modules 1201 and inverter), and at the same time, shorting out the connectors 1401/1402 of the PV module 1201. This provides a safe condition (zero current and voltage) to anything outside the shorted PV module 1201. In this way, the PV module 1201 provides the power to needed to operate the module-off switch to shut itself down.

In implementations a system monitor 301, 400, 1203 may be integrated within, or otherwise formed as a part of, an inverter 105, 113, 1206. In implementations the module-on switch 1406, module-off switch 1407, and module-off logic 1409 will be implemented in a junction box. In other implementations one or more or all of these components may be miniaturized and/or embedded or integrally formed with each other and/or with other elements disclosed herein.

In implementations of a solar photovoltaic module safety shutdown system a DC disconnect may be positioned on a roof near a PV array and a system-on signal may be generated as disclosed herein, with the power supply tied to an AC panel and a manual (on/off) switch at ground level. This may comply with NEC 2014 code and may, in implementations, comply with NEC 2017 code which may call for, by example, less than a 10 foot perimeter around the PV array to be allowed to have live DC voltage after a system shutdown.

The above disclosure describes various solar photovoltaic module safety shutdown systems whereby an array of PV modules may be deactivated from a single control signal. In such implementations each individual PV module may be activated by a system-on signal. The module-on switch will either be off (switch open and PV system off) or on (switch closed, system-on signal being transmitted, and PV system operational). Such systems allow individual PV modules to be shut off by default and may increase the safety of such systems since the lack of the system-on signal disables them, even when in the presence of light.

Figure 17:
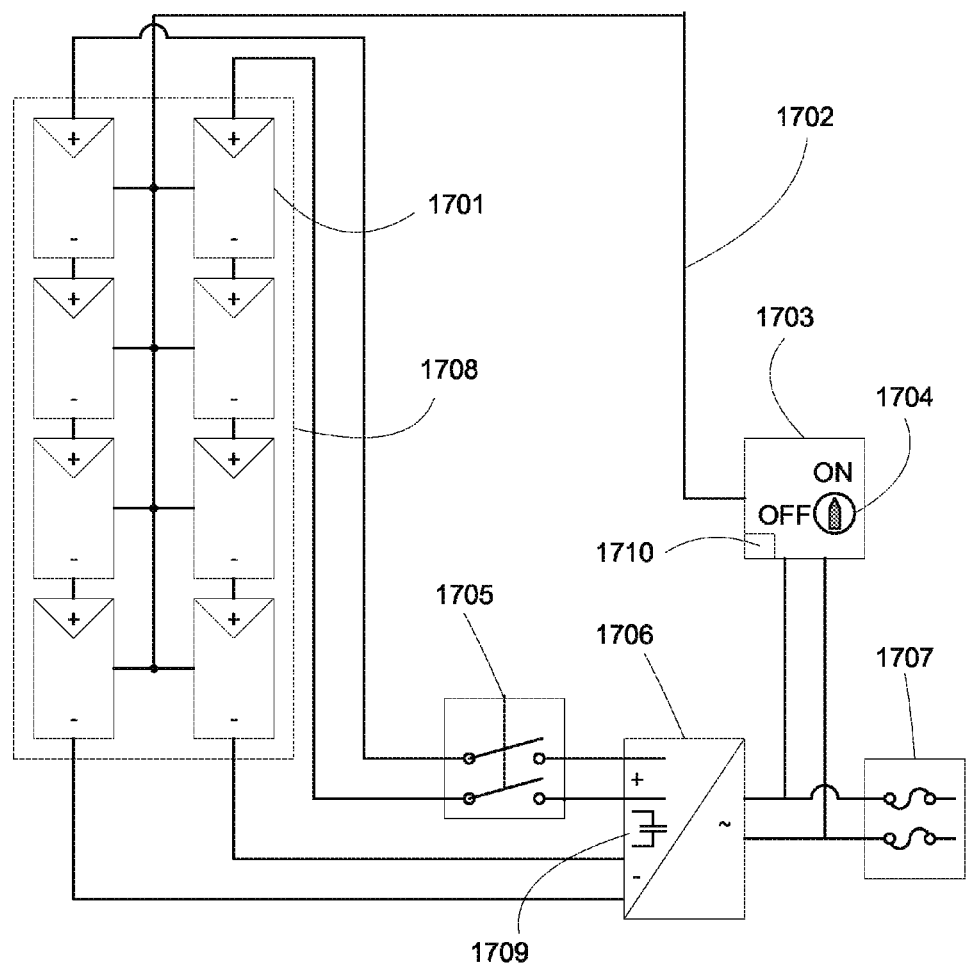
FIG. 17 is a schematic diagram of an implementation of a PV system.

In some solar PV module safety shutdown systems, such as the grid-tied system shown in FIG. 17, many of the above described elements are present. A number of PV modules 1701 are wired together to form a PV array 1708. Each module by itself generates power/current when exposed to light. The PV array is coupled through a DC disconnect 1705 to feed power to a grid-tied inverter 1706, which converts the DC power from the PV array to AC power for the grid by connection to an AC mains panel 1707, which is tied to the grid (not shown). A system monitor 1703 is coupled with the AC mains panel and generates a system-on signal 1702 as has been previously described. The system-on signal indicates to each individual PV module when it is safe to provide power to the PV array. The system monitor includes a manual switch 1704, and the system-on signal is only generated when the manual switch is in the "on" position.

A timer/light sensor 1710 may be coupled with the system monitor. This may be used to reduce the overall energy used in sending the system-on signal by simply removing the system-on signal at night (or when there is insufficient light irradiating the PV module to produce a desired output level). If a light sensor is used then, so long as the manual switch is in the ON position, the system-on signal will be generated when there is a threshold amount of light irradiating the light sensor and the system-on signal will not be generated otherwise. This would, for instance, allow the system-on signal to be turned off whenever there is insufficient light regardless of the time of day (such as when dark storm clouds are present, if the light threshold is adjusted accordingly), and it would inherently account for changes in the daylight hours resulting from varying latitudes and the earth's orbit. A timer, if used, may include settings that adjust the timer automatically to account for latitude and changes in daylight hours throughout the year, etc. In some implementations the use of a timer may reduce the overall energy spent in sending the system-on signal by about 50%. Thus, a timer/light sensor may reduce the parasitic power loss of a rapid shutdown circuit. Simple timing circuits that may be used in various implementations to construct such a timer will be understood by the practitioner of ordinary skill in the art. The use of the timer/light sensor will also reduce the operating time (and correspondingly increasing—in some cases doubling—the life expectancy) of opto-circuits that will be described hereafter.

As can be seen from FIG. 17, the inverter includes an inherent capacitance across the DC input which is represented by capacitor 1709. When the system-on signal ceases to be generated, such as when the manual switch is turned to the off position, the individual PV modules may thereby be turned off or shorted, but the inherent capacitance will mean that the inverter still needs some time to fully discharge. System elements will be discussed below which may rapidly discharge the inherent capacitance of the inverter in order to more quickly bring the voltage/current in the system down to safe levels.

The inherent capacitance of some inverters will store considerable energy and would need to be dissipated through a discharge circuit. Such a discharge circuit may discharge using resistors, chokes, and so forth. The representative examples given below use one or more resistors. The discharge circuit allows for current limiting control of the inverter during shutdown of the PV module/array.

Figure 19:
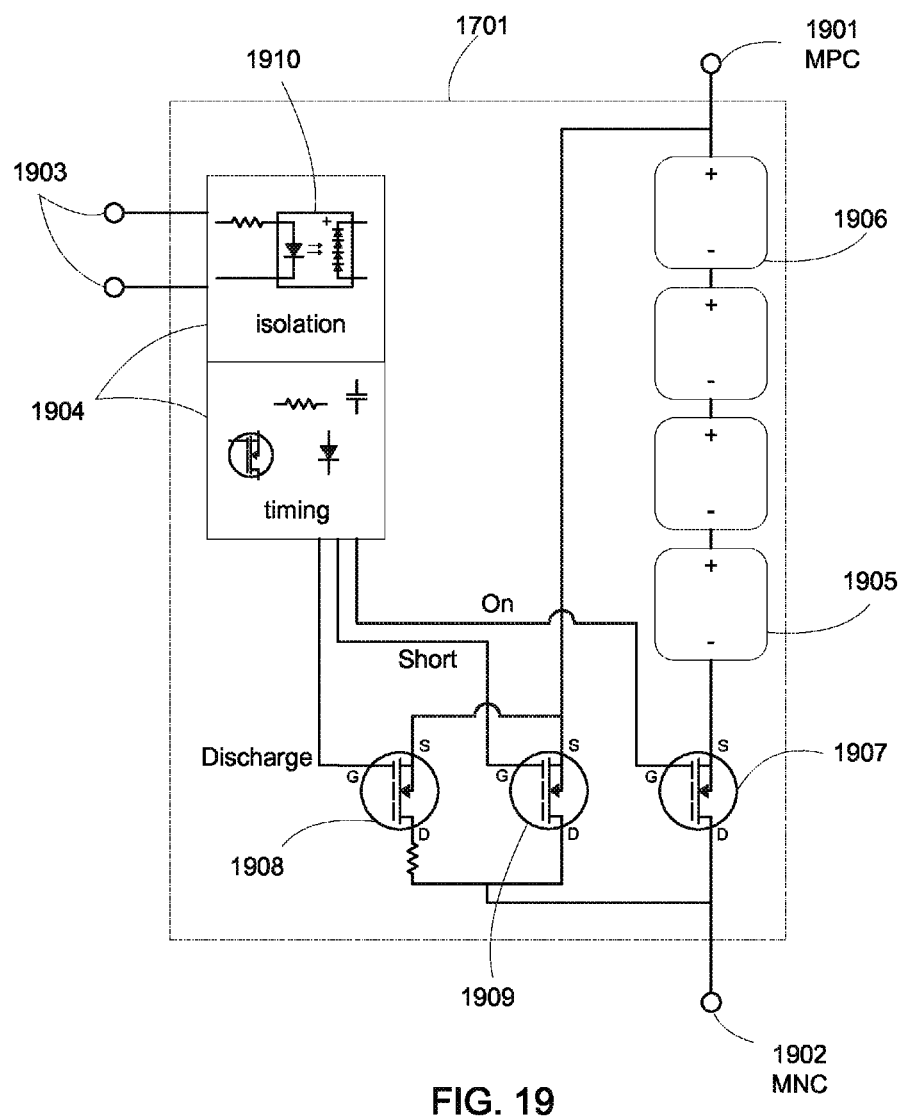
FIG. 19 is a schematic diagram of an implementation of a solar PV module safety shutdown system.

FIG. 19 shows a solar photovoltaic (PV) module safety shutdown system (system) that includes a discharge circuit and will now be described. Each PV module includes a plurality of PV cells that are aligned in series, including a first cell 1905 and a last cell 1906. Each PV module has a module positive connector (MPC) 1901 coupled with the last cell and a module negative connector (MNC) 1902 coupled with the first cell through a module-on switch 1907. A pair of system-on connectors 1903 are shown operating a FET driver 1910, which in the implementation shown is an opto-isolator, and module control logic 1904 utilizes the system-on signal to control the module-on switch, a module discharge switch 1908, and a module short switch 1909. The module control logic includes an isolation and timing circuit as will be shown and discussed hereafter (and in some implementations includes the module discharge switch and module short switch). The FET driver 1910 may have any of the properties and structures disclosed in this document related to FET drivers and the system-on connectors likewise be any of the system-on connectors disclosed herein.

By non-limiting example, in various implementations, during normal ON operation, i.e., with the manual switch in the ON position and with power at the AC mains panel and with light irradiating the PV modules, the system-on signal is generated by the system monitor and the module control logic utilizes this signal to turn on the module-on switch, so that the first cell is electrically connected with MNC 1902. Thus the PV module may generate a direct current (along with other PV modules in the array).

When the system-on signal is no longer generated, such as when a fire is occurring and a firefighter toggles the manual switch off or turns off the AC mains panel, and the system monitor in response ceases generating the system-on signal, the module control logic 1904 may, in response, turn off the module-on switch 1907. This begins a shutdown sequence with a module-off system, which includes a module discharge switch and a module short switch. First, the module control logic will turn on the module discharge switch 1908. Turning off the module-on switch means that the first cell 1905 is no longer electrically connected with MNC 1902, and turning on the module discharge switch means that the MPC and MNC nodes are connected through a discharge element, as may be seen in FIG. 19 illustrated as a resistor. The discharge element then quickly discharges the capacitor/inherent capacitance of the inverter to a safe level, which may occur in a matter of seconds (such as less than 10 seconds). In implementations the module-on switch may be turned off simultaneously with the turning on of the module discharge switch.

The module control logic 1904 may be configured to turn off the module discharge switch and turn on the module short switch 1909 at a point in time when the inherent capacitance of the inverter has sufficiently drained to a safe level (or has fully drained). By using the resistor or other discharge element as previously described during the discharge period, the current passing between MPC and MNC may be limited and tailored so that it is within the specifications that are safe for the inverter. Most inverters have a threshold current rate that should not be exceeded. Thus, if the MPC and MNC nodes were immediately coupled together using the module short switch when the system-on signal is not received, the current passing between them may exceed the threshold level of the inverter and may damage the inverter. Using the discharge element first, to rapidly discharge the inherent capacitance of the inverter while simultaneously limiting the current to a level safe for the inverter, allows a method to be used to quickly discharge the capacitor/inherent capacitance to a safe level.

Figure 18:
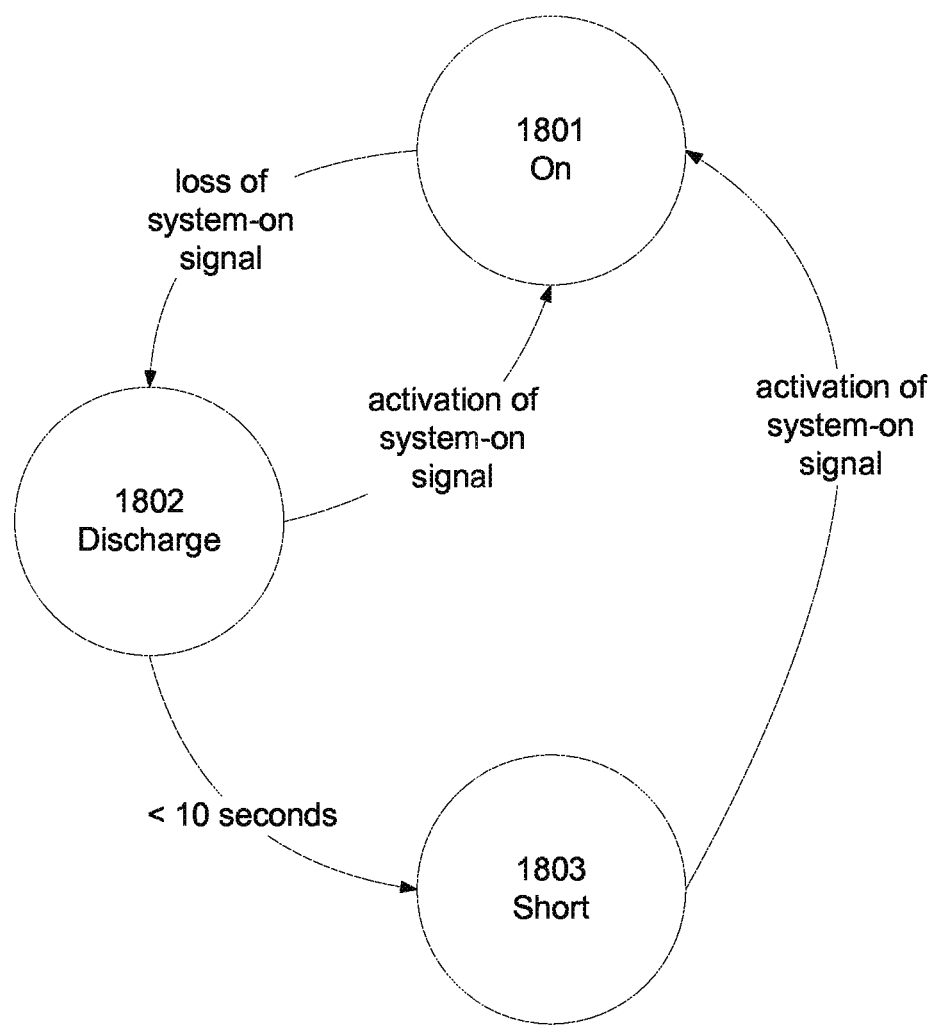
FIG. 18 is an illustration representatively showing various states of the system of FIG. 19.

FIG. 18 shows a state diagram for the system of FIG. 19. The system is in an on state 1801 during normal operation when the system-on signal is present. In this state the PV modules are providing power to the PV system. When the system-on signal is no longer generated the system enters a discharge state 1802 during which the PV module is discharged through a discharge element, as described above, by turning off the module-on switch 1907 and turning on the module discharge switch 1908. If the system-on signal is again received during this state the module discharge switch 1908 is simply switched off and the module-on switch is turned back on so that the system returns to the on state 1801.

If the system-on signal is not received during the discharge state then, after a certain amount of time has passed (which in the figure is illustrated as being, in some implementations, less than 10 seconds for full discharge or for discharge to levels safe for a human), then the system enters the short state 1803 by turning off the module discharge switch and turning on the module short switch 1909 (in this state the module-on switch remains off). During the short state there is a low impedance path between MPC and MNC to maintain a safe array and also protect circuits in the PV module junction box (described hereafter) in case, by non-limiting example, only one module of the array is shut down due to wiring errors (this situation being covered in greater detail above). This is accordingly a shutdown state of the PV system. If the system-on signal is received while the system is in the short state 1803, then the module short switch 1909 is turned off, the module-on switch is turned on, and the system re-enters the on state 1801.

Figure 20:
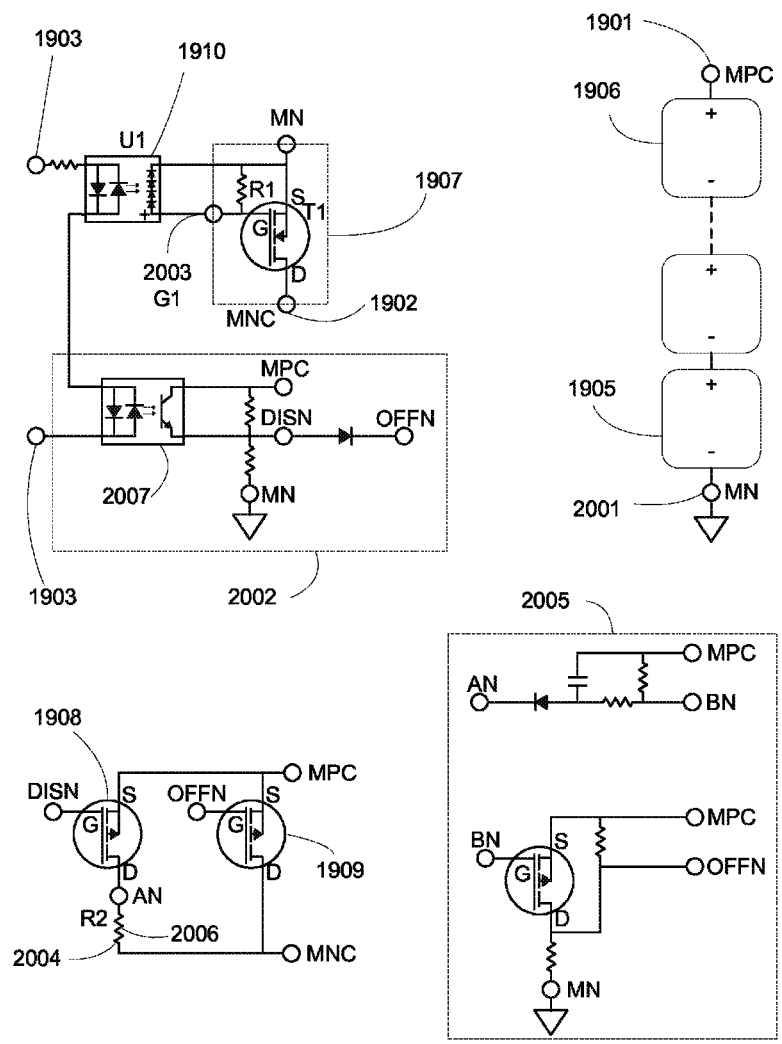
FIG. 20 is s schematic diagram illustrating various components of the system of FIG. 19.
Figure 22:
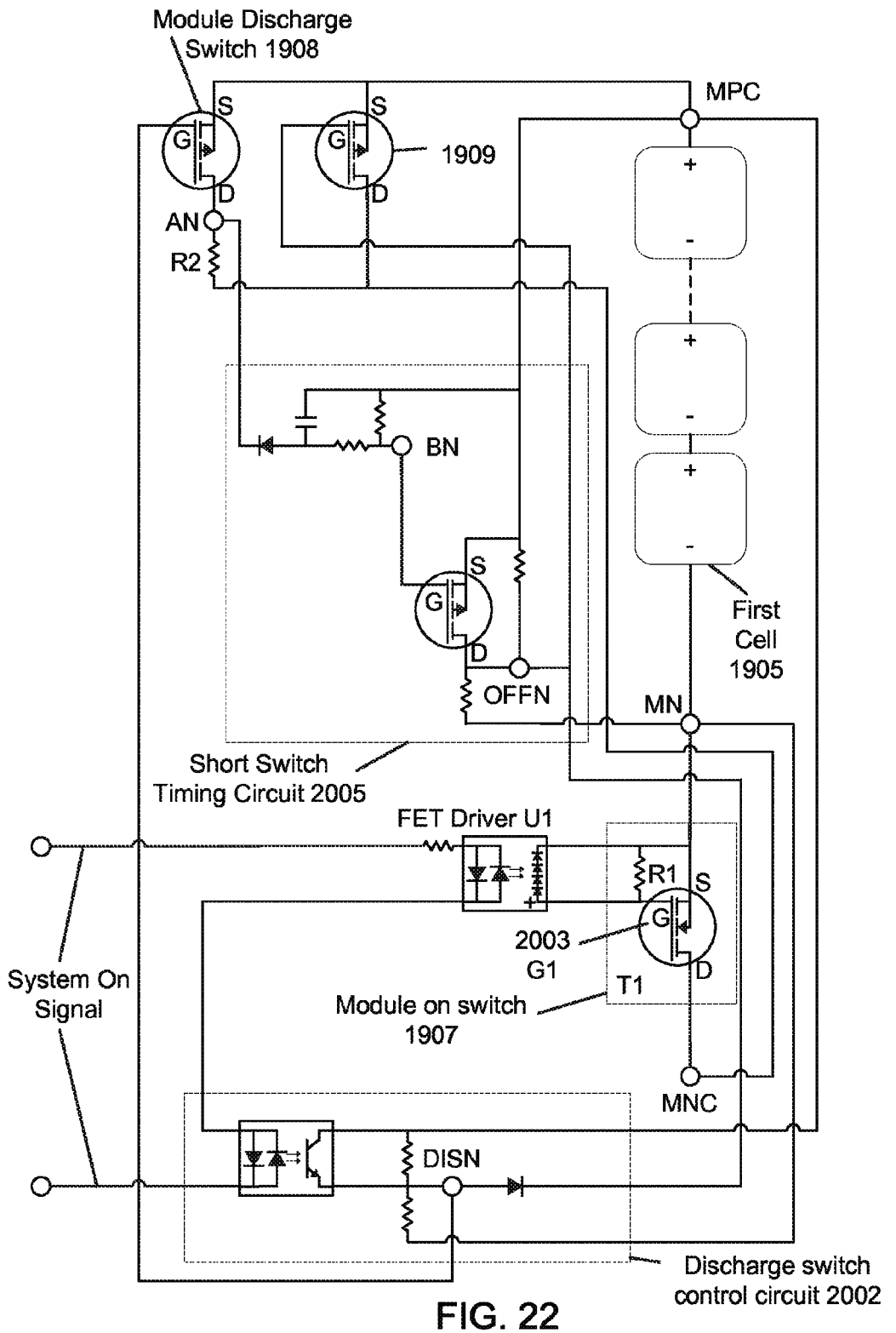
FIG. 22 is a schematic diagram showing illustrating various components of the system of FIG. 19.

The module control logic 1904 shown in FIG. 19 may be implemented in a number of ways using a number of elements. Thus, in FIG. 19 the module control logic is seen as including one or more FET drivers 1910 or opto-isolators, resistors, capacitors, diodes, transistors or switches, and so forth. FIGS. 20 and 22 give one representative example of a way to implement the control logic. In FIG. 20 various functional circuits are grouped for clarity, while FIG. 22 illustrates the interrelations of the functional groups.

Referring now to FIG. 20, the upper right hand image shows an example of a plurality of PV cells, including a first cell 1905 and a last cell 1906. The dashed line in between the middle cell and the last cell is intended to indicate that any number of cells could be included between the first cell and last cell. The first cell is connected to a module negative (MN) 2001 node, while the last cell is connected to the module positive connector 1901. The typical PV module bypass diodes are not shown in FIG. 20, for clarity, and in implementations do not interact with the functions described herein.

At the upper left of FIG. 20 is a representation of the module-on switch 1907. As can be seen, in the implementation shown a transistor T1 having a gate 2003 (G1), source S and drain D is shown. A resistor R1 is shown between G1 and MN and may be used to drain the T1 transistor when it is in the off state. The system-on connector 1903 is coupled with a FET driver 1910 (U1) which is an opto-isolator. Thus, when the system-on signal passes through U1 the transistor T1 is turned on due to the G1 voltage being positive in relation to the MN node. This will electrically couple the MN node with the module negative connector (MNC) 1902. The FET driver thus uses the control signal to generate light internally and this light is in turn used to generate the FET gate driving signal that is optically isolated from the control signal (system-on signal). In this way the FET driver U1 provides the positive G1 signal, and the gate source voltage provided by an active G1 will turn T1 fully on.

Below the module-on switch in FIG. 20 the discharge switch control circuit 2002 is shown. The system-on signal is routed to the opto-isolator 2007 (which in the implementation shown is a phototransistor opto-isolator) through the system-on connectors 1903. When the opto-isolator 2007 is in the ON state the MPC node is coupled with the DISN node without having to pass through a resistor, and thus they are at the same voltage and form the same node. The DISN node is separated from the OFFN node through a diode, and the DISN node is further separated from the MN node through a resistor. When the system-on signal is not present, the opto-isolator 2007 is in the off state and the nodes MPC and DISN are separated by a resistor and therefore form different nodes. The DISN signal in such a state then turns on the module discharge switch 1908, shown at the bottom left of FIG. 20. This couples MPC to MNC through the discharge element 2004 which may be a resistor 2006, though it could also include other discharge elements such as an inductor, an active circuit, and so forth. When the inherent capacitance of the inverter has fully discharged (or has discharged to a safe level), the module short switch will be turned on, as will be described hereafter. When the system-on signal is present the opto-isolator 2007 will turn off both DISN and OFFN immediately.

At the bottom left of FIG. 20 is shown the module discharge switch 1908. When the system-on signal is turned off, the OFFN signal/node causes the module short switch 1909 to turn on, which shorts the PV module by coupling MPC with MNC. OFFN is generated in the short switch timing circuit 2005. Referring to the bottom right of FIG. 20, this process is accomplished through nodes AN and BN. The short switch timing circuit 2005 includes node AN, which is coupled with the drain of the module discharge switch 1908, and which is separated by MPC by a capacitor and a diode, and separated from the BN node through a resistor and the diode. The MPC node is separated from the BN node through a resistor. As shown at the bottom right of the short switch timing circuit drawing, the BN node is coupled with the gate of a transistor switch whose source is coupled with MPC and whose drain is coupled with the OFFN node. The drain is also coupled with MN through a resistor, and the MPC and OFFN nodes are coupled through a resistor.

By means of the AN node, a low impedance of the module discharge switch may be sensed to indicate that the module discharge switch is on. AN is delayed through a basic resistor-capacitor network to produce the time-delayed node BN. BN is amplified in a transistor to create the node OFFN to turn on (low impedance) the module short switch 1909 shortly after the discharge of the PV array and inverter capacitance (or shortly after the rapid shutdown) is complete. Sizing the discharge element 2004 (such as resistor R2) will allow for the correct current limit required for the inverter. Such a circuit may be accomplished in a number of other ways, such as inductors to limit the current, and the schematics shown in the figures are only representative examples of achieving rapid shutdown in a controlled fashion.

Figure 21:
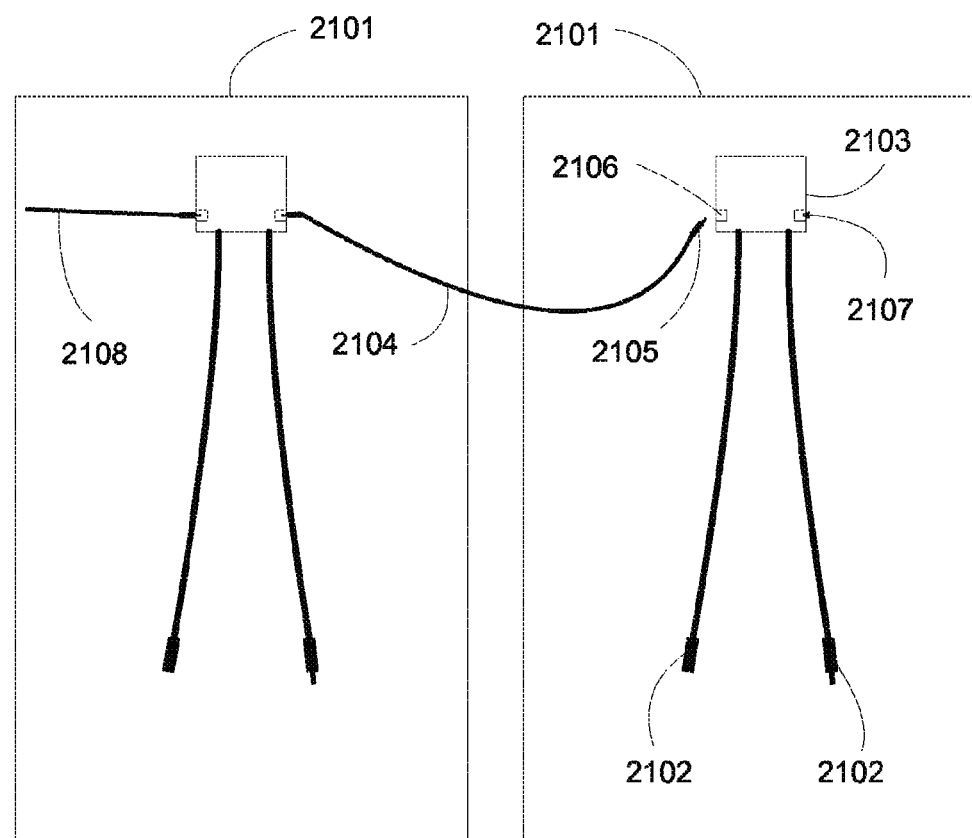
FIG. 21 is a depiction of back sides of implementations of PV modules.

FIG. 22 shows an overall schematic showing the various elements of FIG. 21. Although specific schematics are given in FIGS. 17-22, it should be understood that a system may operate with different internal circuit components and connections. The versions shown are only representative examples of achieving a controlled, current-limited transition from the on state to the discharge state, from the discharge state to the short state, and so forth.

FIG. 21 shows the back sides of a pair of PV modules 2101. A junction box 2103 is included with each module, and each junction box includes a plurality of system-on sockets (sockets) 2106 for receiving system-on cable plugs 2105 of system-on signal cables 2104, which may be daisy-chained as shown in FIG. 21 to form a daisy chain 2108 (which will land on the system monitor 1703). A socket plug 2107 may be used for unused sockets to protect against dust and moisture contamination. DC power connectors 2102 are also coupled with each junction box.

The manner in which the various cables are implemented may reduce the implementation cost of a PV system. As shown in FIG. 21, the system-on signal may be connected between the module junction boxes using a single cable, the socket (receptacle) being integrated into the junction box and the cable having a plug on each end. In order to reduce the cost of the signal-on wiring in the array the socket is integrated in the junction box, and a the system-on signal cable is provided in at least two lengths, one for module portrait orientation, and the other for module landscape orientation, these cables then being a more exact length. This reduces overall cable length and keeps wire management simpler (no coiling and excess that must be managed), reducing the overall cost (parts and labor) associated with the signal wiring. In implementations more than one socket is provided per junction box, and in some cases at least two as shown, or more, allowing some flexibility during installation.

The PV modules shown in FIG. 21 are mounted in the portrait method, with a shorter interconnecting system-on signal cable 2104 between the two modules. If the modules were mounted in the landscape method a longer cable could be used. In this way the cables may be only as long as they need to be. The conventional method for DC power connectors 2102 is to use connectors long enough to be able to connect in either landscape or portrait.

Conventional direct current (DC) PV modules are not able to be directly controlled to achieve rapid shutdown. Conventional DC modules with power optimizers (DC to DC converters) built into the modules can be controlled to power down individual modules and thus break an array. Conventional alternating current (AC) PV modules include integrated microinverters, such as in each module junction box, and are able to shut down individual modules in the absence of grid voltage. For the purposes of this disclosure, a microinverter is defined as a small inverter configured to convert the DC output of only a single PV module to alternating current and rated from about 190 to about 250 Watts. DC power optimizers and microinverters have circuits that are very complex, prone to failure, expensive, and have relatively short lives compared with the life expectancy of a silicon cell. Thus, modules with DC power optimizers and/or microinverters have a shortened useful life. As shown in the figures and as described, in implementations solar PV module safety shutdown systems disclosed herein include neither DC power optimizers nor microinverters.

Another option for rapid shutdown would be to use a solenoid (contactor) near the array, allowing the conductors between the array and the inverter to become disconnected from the array. However, such a solution would not shut down each individual module and therefore the inter-module conductors would remain energized. Additionally, the inverter would need to discharge its inherent capacitance itself. Traditional inverters may require about five minutes to safely discharge on their own, far longer than required by NATIONAL ELECTRICAL CODE® (NEC®) standards for rapid shutdown published by National Fire Protection Association, Inc. of Quincy, Mass. Accordingly, such a solution would require either additional solenoids used near the inverter to isolate the conductors between the inverter and the array, or the inverter would need to employ a circuit to discharge the capacitance of the inverter when a rapid shutdown event is sensed. Furthermore, solenoids in traditional PV systems currently draw a substantial amount of power and are designed to be normally open, thus they require constant power to remain closed. This amount of power is considerably higher than the power required to operate the system-on signal as disclosed herein. The systems disclosed herein are able to both isolate/short out the PV modules within an array and also safely discharge the inverter without the use of solenoid contactors.

Another option for module shutdown would be to provide a PV system that is shorted out or that has a circuit interruption in response to an off-signal. This would require some signal present to turn on the transistor (or other switch or element) that shorts out the module. The signal would need to be present even when the PV module is disconnected from the array if the module is in the presence of light. The PV module itself could provide the power to run such a mechanism but, when in the array, shorting out a module across all the cells would remove the voltage/power to power such logic. One way around this is to ensure that the shorting occurs simultaneous with the PV module being isolated from the array. For example, a module connector (MPC or MNC) could be isolated from the module cells, isolating the module from other modules and from the inverter, and the module connectors MPC, MNC could be shorted at the same moment. This would provide a safe condition (zero current and voltage) to anything outside the module and would meet the NEC® rapid shutdown requirements, and would not require power to run an off-signal after the PV module has been isolated from other modules.

The solar PV module safety shutdown systems described herein provide simple circuits to rapidly shutdown a PV module. The circuits and other electrical components used (connectors and wires) are inexpensive, available from multiple sources, and very reliable over time and in high temperature. The systems herein are thus low cost and reliable rapid module (and PV array) shutdown systems that do not require DC optimizers or microinverters.

Furthermore, with respect to the solar PV module safety shutdown systems disclosed herein, as the inverter grows in size so does the array, and as the number of modules increases there are more discharge elements 2004 (such as power dissipation resistors 2006) in the overall system to discharge the larger inverter. Accordingly, the system easily scales itself up with the size of the inverter, and different types of modules are therefore not needed for larger or smaller PV systems. Each PV module in series and in parallel in the array will provide a part of the energy discharge.

In places where the description above refers to particular implementations of solar photovoltaic module safety shutdown systems and related methods and implementing components, sub-components, methods and sub-methods, it should be readily apparent that a number of modifications may be made without departing from the spirit thereof and that these implementations, implementing components, sub-components, methods and sub-methods may be applied to other solar photovoltaic module safety shutdown systems and related methods.

What is claimed is:

1. A solar photovoltaic (PV) module safety shutdown system, comprising:
a module-on switch operatively coupled with a photovoltaic (PV) module, the PV module coupled with an alternating current (AC) mains panel through an inverter;
a system monitor operatively coupled with the module-on switch and with the AC mains panel, the system monitor configured to generate a system-on signal, and;
a module discharge switch operatively coupled with an inherent capacitance of the inverter and with the system monitor;
wherein the module discharge switch discharges the inherent capacitance, by coupling the inherent capacitance with a discharge element, in response to the system monitor not generating the system-on signal.

2. The system of claim 1, further comprising a module short switch that shorts the PV module in response to a passage of a predetermined amount of time after the module discharge switch is switched on.

3. The system of claim 1, wherein the module-on switch and the module discharge switch are comprised in a junction box of the PV module.

4. The system of claim 3, wherein the junction box comprises a plurality of sockets configured to receive system-on signal cables.

5. The system of claim 1, wherein the module-on switch and module discharge switch are coupled with the system monitor through one or more opto-isolators.

6. The system of claim 1, wherein one of a timer and a light sensor is coupled with the system monitor and the system monitor is configured to, using the one of a timer and light sensor, cease generating the system-on signal during nighttime hours.

7. The system of claim 1, wherein the PV module does not comprise a direct current (DC) optimizer.

8. The system of claim 1, wherein the PV module does not comprise a microinverter.

9. A solar photovoltaic (PV) module safety shutdown system, comprising:
a photovoltaic (PV) module comprising a module-on switch, a module discharge switch, and a module short switch operatively coupled thereto, the PV module further coupled with an alternating current (AC) mains panel through an inverter, the PV module further coupled with a system monitor;
wherein the system monitor is configured to generate a system-on signal and to supply the system-on signal to the PV module;
wherein the module-on switch is configured to disable the PV module through disconnecting the PV module from an electrical circuit in response to the PV module not receiving the system-on signal;
wherein the module discharge switch discharges an inherent capacitance of the inverter by coupling the inherent capacitance with a discharge element in response to the PV module not receiving the system-on signal, and;
wherein the module short switch shorts the PV module in response to a passage of a predetermined amount of time after the PV module stops receiving the system-on signal.

10. The system of claim 9, wherein the module-on switch, the module discharge switch, and the module short switch are comprised in a junction box of the PV module.

11. The system of claim 10, wherein the junction box comprises a plurality of sockets configured to receive system-on signal cables.

12. The system of claim 9, wherein the module-on switch, the module discharge switch, and the module short switch are coupled with the system monitor through one or more opto-isolators.

13. The system of claim 9, wherein the PV module does not comprise a direct current (DC) optimizer and wherein the PV module does not comprise a microinverter.

14. A solar photovoltaic (PV) module safety shutdown system, comprising:
a first photovoltaic (PV) module comprising a first module-on switch and a first module discharge switch, the first PV module operatively coupled with an alternating current (AC) mains panel through an inverter;
a second PV module comprising a second module-on switch and a second module discharge switch, the second PV module operatively coupled with the AC mains panel through the inverter, and;
a system monitor operatively coupled with the first PV module, the second PV module, and the AC mains panel, the system monitor configured to generate a system-on signal and supply the system-on signal to the first PV module and the second PV module;
wherein, in response to the first PV module not receiving the system-on signal, the first module discharge switch discharges an inherent capacitance of the inverter by coupling the inherent capacitance with a first discharge element, and;
wherein, in response to the second PV module not receiving the system-on signal, the second module discharge switch discharges the inherent capacitance of the inverter by coupling the inherent capacitance with a second discharge element.

15. The system of claim 14, wherein the first module-on switch is configured to disable the first PV module through disconnecting the first PV module from an electrical circuit in response to the first PV module not receiving the system-on signal, and wherein the second module-on switch is configured to disable the second PV module through disconnecting the second PV module from an electrical circuit in response to the second PV module not receiving the system-on signal.

16. The system of claim 14, wherein the first PV module comprises a first module short switch that shorts the first PV module in response to a passage of a predetermined amount of time after the first module discharge switch is turned on, and wherein the second PV module comprises a second module short switch that shorts the second PV module in response to a passage of a predetermined amount of time after the second module discharge switch is turned on.

17. The system of claim 14, wherein the first module-on switch and the first module discharge switch are comprised in a first junction box of the first PV module, and wherein the second module-on switch and the second module discharge switch are comprised in a second junction box of the second PV module.

18. The system of claim 17, wherein the first junction box comprises a plurality of sockets configured to receive system-on signal cables, and wherein the second junction box comprises a plurality of sockets configured to receive system-on signal cables.

19. The system of claim 14, wherein the first module-on switch, the second module-on switch, the first module discharge switch, and the second module discharge switch are coupled with the system monitor through one or more opto-isolators.

20. The system of claim 14, wherein the system does not comprise a direct current (DC) optimizer and wherein the system does not comprise a microinverter.

* * * * *